(12) United States Patent
Chen et al.

(10) Patent No.: US 11,705,381 B2
(45) Date of Patent: Jul. 18, 2023

(54) HIGH EFFICIENCY HEAT DISSIPATION USING THERMAL INTERFACE MATERIAL FILM

(71) Applicant: Taiwan Semiconductor Manufacturing Co., Ltd., Hsinchu (TW)

(72) Inventors: Chih-Hao Chen, Taipei (TW); Hung-Yu Chen, Hsinchu (TW); Pu Wang, Hsinchu (TW); Li-Hui Cheng, New Taipei (TW); Szu-Wei Lu, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 30 days.

(21) Appl. No.: 17/375,304

(22) Filed: Jul. 14, 2021

(65) Prior Publication Data

US 2022/0392823 A1 Dec. 8, 2022

Related U.S. Application Data

(60) Provisional application No. 63/196,958, filed on Jun. 4, 2021.

(51) Int. Cl.
*H01L 23/373* (2006.01)
*H01L 23/31* (2006.01)
*H01L 23/04* (2006.01)
*H01L 23/40* (2006.01)
*H01L 21/48* (2006.01)

(52) U.S. Cl.
CPC ...... *H01L 23/3737* (2013.01); *H01L 21/4882* (2013.01); *H01L 23/04* (2013.01); *H01L 23/3128* (2013.01); *H01L 23/4006* (2013.01); *H01L 2023/4087* (2013.01)

(58) Field of Classification Search
CPC . H01L 23/3737; H01L 23/04; H01L 23/3128; H01L 23/4006; H01L 21/4882; H01L 2023/4087
See application file for complete search history.

(56) References Cited

U.S. PATENT DOCUMENTS 5,436,202 A * 7/1995 Miura ............... H01L 21/50
228/9
8,993,380 B2 3/2015 Hou et al.
(Continued)

FOREIGN PATENT DOCUMENTS

TW 201903996 A 1/2019
WO 2004090938 A2 10/2004

*Primary Examiner* — Peniel M Gumedzoe
(74) *Attorney, Agent, or Firm* — Slater Matsil, LLP

(57) ABSTRACT

A method of forming a semiconductor structure includes: attaching a semiconductor device to a first surface of a substrate; placing a thermal interface material (TIM) film over a first side of the semiconductor device distal from the substrate, where the TIM film is pre-formed before the placing, where after the placing, a peripheral portion of the TIM film extends laterally beyond sidewalls of the semiconductor device; and attaching a lid to the first surface of the substrate to form an enclosed space between the lid and the substrate, where after attaching the lid, the semiconductor device and the TIM film are disposed in the enclosed space, where a first side of the TIM film distal from the substrate contacts the lid.

20 Claims, 19 Drawing Sheets

(56) References Cited

U.S. PATENT DOCUMENTS

| | | |
|---|---|---|
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 2004/0082188 A1 | 4/2004 | Chrysler et al. |
| 2011/0278715 A1* | 11/2011 | Ihara ................. H01L 24/82 257/E23.08 |
| 2012/0153448 A1* | 6/2012 | Ihara ............. H01L 21/76838 257/E21.705 |
| 2012/0247664 A1* | 10/2012 | Kobayashi ........... H01L 24/75 156/308.2 |
| 2013/0134574 A1* | 5/2013 | Ihara ................. H01L 23/42 257/E23.101 |
| 2014/0027899 A1 | 1/2014 | Krishnan et al. |
| 2016/0222256 A1* | 8/2016 | Kato ..................... C09J 7/22 |
| 2017/0162542 A1* | 6/2017 | Chen .................. H01L 21/56 |
| 2018/0350754 A1* | 12/2018 | Huang ............. H01L 21/4853 |
| 2019/0164864 A1* | 5/2019 | Arvin ............... H01L 23/3736 |
| 2019/0329367 A1* | 10/2019 | Tsai ................. H01L 21/4882 |
| 2020/0058571 A1* | 2/2020 | Wang ................ H01L 23/433 |
| 2020/0219786 A1 | 7/2020 | Hung et al. |
| 2020/0402926 A1 | 12/2020 | Huang et al. |
| 2021/0118770 A1 | 4/2021 | Kuo et al. |

* cited by examiner

HIGH EFFICIENCY HEAT DISSIPATION USING THERMAL INTERFACE MATERIAL FILM

PRIORITY CLAIM AND CROSS-REFERENCE

This application claims priority to U.S. Provisional Patent Application No. 63/196,958, filed Jun. 4, 2021 and entitled "New Film TIM Development for High Efficiency Heat Dissipation," which application is hereby incorporated by reference in its entirety.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. Another example is a Chip-on-Wafer-on-Substrate structure, where a semiconductor chip is attached to a wafer (e.g., an interposer) to form a Chip-on-Wafer structure. The Chip-on-Wafer structure is then attached to a substrate (e.g., a printed circuit board) to form a Chip-on-Wafer-on-Substrate structure. These and other advanced packaging technologies enable production of semiconductor devices with enhanced functionalities and small footprints.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1B:
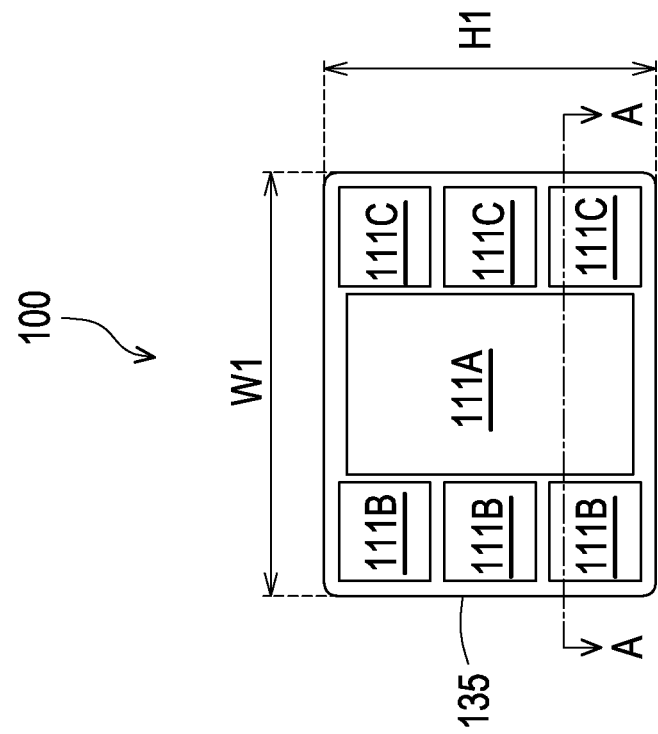
FIG. 1B illustrates a top view of the semiconductor device of FIG. 1A, in accordance with an embodiment.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. Throughout the description, unless otherwise specified, like reference numerals in difference figures refer to the same or similar component formed by a same or similar method using a same or similar material(s). Furthermore, figures with the same numeral but different alphabets (e.g., FIGS. 3A and 3B) illustrate various views (e.g., cross-sectional view, top view) of the same structure at the same stage of the fabrication process.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are discussed herein in the context of forming a Chip-on-Wafer-on-Substrate structure with a thermal interface material (TIM) film. The principle of the present disclosure may be applied to other structures or devices, such as Integrated Fan-Out (InFO) packages, or System-on-Integrated Circuit (SoIC) packages.

In some embodiments, a semiconductor device is attached to a substrate, and a pre-formed TIM film is then placed (e.g. laminated) on an upper surface of the semiconductor device distal from the substrate. The TIM film is formed of a material that comprises carbon and polymer. A thermal conductivity of the TIM film may be over 20 watts per meter-kelvin ($W/(m \cdot K)$). Next, a roller may roller over the TIM film to press the TIM film firmly against the upper surface of the semiconductor device. Next, a lid is attached to the substrate over the TIM film and the semiconductor device, where the TIM film and the semiconductor device are disposed in an enclosed space between the lid and the substrate. A clamp cure process is then performed to cure the TIM film. The TIM film provides improved heat dissipation efficiency compared with conventional gel type TIM material. In addition, the shape and the thickness of the TIM film is easy to control, which results in excellent coverage ratio of the upper surface of the semiconductor device. Since the TIM film is easy to use in manufacturing, the throughput of the manufacturing process is also improved.

Figure 1A:
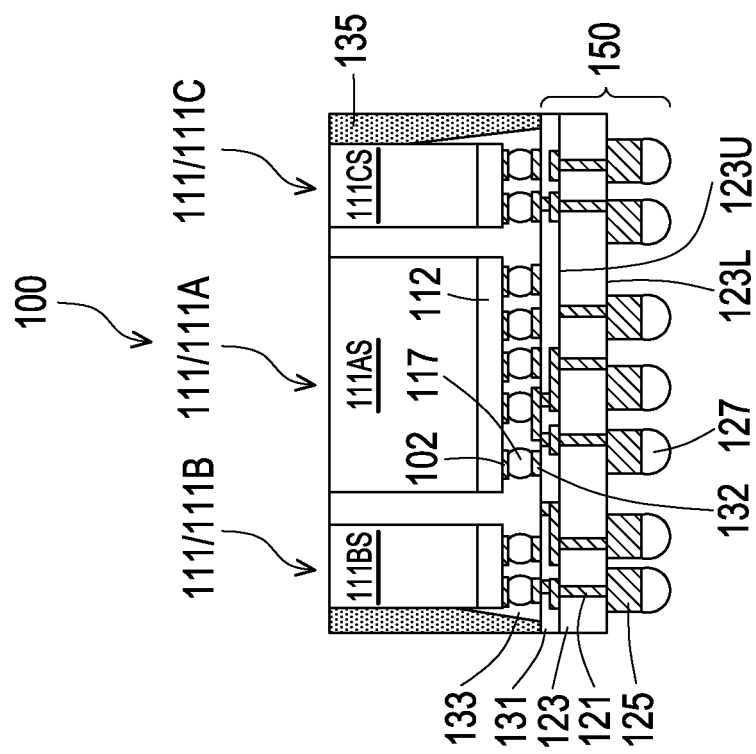
FIG. 1A illustrates a cross-sectional view of a semiconductor device, in accordance with an embodiment.

FIG. 1A illustrates a cross-sectional view of a semiconductor device 100, in accordance with an embodiment. The semiconductor device 100 has a Chip-on-Wafer structure. As illustrated in FIG. 1A, the semiconductor device 100 includes a wafer 150 (e.g., an interposer), one or more dies 111 (e.g., 111A, 111B, and 111C) attached to the wafer 150, an underfill material 133 between the dies 111 and the wafer 150, and a molding material 135 over the wafer 150 and around the dies 111. The semiconductor device 100 is subsequently attached to a substrate to form a semiconductor device 200 having a Chip-on-Wafer-on-Substrate structure, details of which are described hereinafter.

To form the semiconductor device 100, one or more dies 111 (may also be referred to as semiconductor dies, chips, or integrated circuit (IC) dies) are attached to an upper surface of the wafer 150. In the illustrated embodiment, the wafer 150 is an interposer, and therefore, the wafer 150 may also be referred to as an interposer in the discussion herein, with the understanding that other types of suitable wafers may also be used as the wafer 150. The dies 111 (e.g., 111A, 111B, and 111C) are a same type of dies (e.g., memory dies, or logic dies), in some embodiments. In other embodiments, the dies 111 are of different types, e.g., the die 111A may be a logic die and the dies 111B and 111C may be memory dies. The number of dies 111 and the relative locations of the dies 111 in FIG. 1A are merely examples, other numbers and other locations of the dies are possible and are fully intended to be included within the scope of the present disclosure.

In some embodiments, the die 111A includes a substrate 111AS, electrical components (e.g., transistors, resistors, capacitors, diodes, or the like) formed in/on the substrate 111AS, and an interconnect structure 112 over the substrate 111AS connecting the electrical components to form functional circuits of the die 111A. The die 111A also includes conductive pads 102 and conductive pillars 117 (also referred to as die connectors) formed on the conductive pads 102. The conductive pillars 117 provide electrical connection to the circuits of the die 111A.

The substrate 111AS of the die 111A may be a semiconductor substrate, doped or undoped, or an active layer of a silicon-on-insulator (SOI) substrate. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates that may be used include multi-layered substrates, gradient substrates, or hybrid orientation substrates. In some embodiments, the semiconductor material of the substrate may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The electrical components of the die 111A comprise a wide variety of active components (e.g., transistors) and passive components (e.g., capacitors, resistors, inductors), and the like. The electrical components of the die 111A may be formed using any suitable methods either within or on the substrate 111AS of the die 111A. The interconnect structure 112 of the die 111A comprises one or more metallization layers (e.g., copper layers) formed in one or more dielectric layers, and is used to connect the various electrical components to form functional circuitry. In an embodiment, the interconnect structure is formed of alternating layers of dielectric and conductive material (e.g., copper) and may be formed through any suitable process (such as deposition, damascene, dual damascene, etc.).

One or more passivation layers (not shown) may be formed over the interconnect structure 112 of the die 111A in order to provide a degree of protection for the underlying structures of the die 111A. The passivation layer may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The passivation layer may be formed through a process such as chemical vapor deposition (CVD), although any suitable process may be utilized.

Conductive pads 102 may be formed over the passivation layer and may extend through the passivation layer to be in electrical contact with the interconnect structure 112 of the die 111A. The conductive pads 102 may comprise aluminum, but other materials, such as copper, may alternatively be used.

Conductive pillars 117 of the die 111A are formed on the conductive pads 102 to provide conductive regions for electrical connection to the circuits of the die 111A. The conductive pillars 117 may be copper pillars, contact bumps such as microbumps, or the like, and may comprise a material such as copper, tin, silver, combinations thereof, or other suitable material.

The dies 111B and 111C are formed using the same or similar processing steps, although different electrical components and different electrical connections may be formed such that circuits with different functions are formed for the different dies. Details are not repeated here.

Looking at the wafer 150, which includes a substrate 123, through vias 121 (also referred to as through-substrate vias (TSVs)), a redistribution structure 131, conductive pads 132 at an upper surface of the wafer 150, and external connectors 125 (may also be referred to as conductive bumps) at a lower surface of the wafer 150. The structure of the wafer 150 in FIG. 1A is merely a non-limiting example. Other structures are possible and are fully intended to be included within the scope of the present disclosure.

The substrate 123 may be, e.g., a silicon substrate, doped or undoped, or an active layer of a silicon-on-insulator (SOI) substrate. However, the substrate 123 may alternatively be a glass substrate, a ceramic substrate, a polymer substrate, or any other substrate that may provide a suitable protection and/or interconnection functionality.

In some embodiments, the substrate 123 may include electrical components, such as resistors, capacitors, signal distribution circuitry, combinations of these, or the like. These electrical components may be active, passive, or a combination thereof. In other embodiments, the substrate 123 is free from both active and passive electrical components therein. All such combinations are fully intended to be included within the scope of this disclosure.

Through vias 121 are formed in the substrate 124 and extend from an upper surface 123U of the substrate 123 to a lower surface 123L of the substrate 123. The through vias 121 provide electrical connections between the conductive pads 132 and the external connectors 125. The through vias 121 may be formed of a suitable conductive material such as copper, tungsten, aluminum, alloys, doped polysilicon, combinations thereof, and the like. A barrier layer may be formed between the through vias 121 and the substrate 123. The barrier layer may comprise a suitable material such as titanium nitride, although other materials, such as tantalum nitride, titanium, or the like, may alternatively be utilized.

Once the through vias 121 have been formed, the redistribution structure 131 may be formed on the upper surface 123U of the substrate 123 in order to provide interconnectivity between the through vias 121, the external connectors 125, and the dies 111A, 111B and 111C. The redistribution structure 131 comprises electrically conductive features (conducive lines and/or vias) disposed in one or more dielectric layers of the redistribution structure 131. In some embodiments, the one or more dielectric layers are formed of a polymer, such as polybenzoxazole (PBO), polyimide, benzocyclobutene (BCB), or the like. In other embodiments, the dielectric layer is formed of a nitride such as silicon nitride; an oxide such as silicon oxide, phosphosilicate glass (PSG), borosilicate glass (BSG), boron-doped phosphosilicate glass (BPSG), or the like; or the like. The one or more dielectric layers of the redistribution structure 131 may be formed by any acceptable deposition process, such as spin coating, chemical vapor deposition (CVD), laminating, combination thereof, or the like.

In some embodiments, the conductive features of the redistribution structure 131 comprise conductive lines and/or conductive via formed of a suitable conductive material such as copper, titanium, tungsten, aluminum, or the like. The conductive features may be formed by, e.g., forming openings in a dielectric layer of the redistribution structure to expose underlying conductive features, forming a seed layer over the dielectric layer and in the openings, forming a patterned photoresist with a designed pattern over the seed layer, plating (e.g., electroplating or electroless plating) the conductive material in the designed pattern and over the seed layer, and removing the photoresist and portions of seed layer on which the conductive material is not formed. After the redistribution structure 131 is formed, the conductive pads 132 may be formed over and electrically coupled to the redistribution structure 131 using any suitable material such as copper, aluminum, gold, tungsten, combinations thereof, or the like.

Next, the external connectors 125 are formed on the lower surface 123L of the substrate 123. The external connectors 125 may be any suitable type of external contacts, such as microbumps, copper pillars, a copper layer, a nickel layer, a lead free (LF) layer, an electroless nickel electroless palladium immersion gold (ENEPIG) layer, a Cu/LF layer, a Sn/Ag layer, a Sn/Pb, combinations thereof, or the like.

As illustrated in FIG. 1A, the conductive pillar 117 of the dies 111 are bonded to the conductive pads 132 of the wafer 150 by, e.g., solder regions. A reflow process may be performed to bond the dies 111 to the wafer 150.

After the dies 111 are bonded to the wafer 150, an underfill material 133 is formed between the dies 111 and the wafer 150. The underfill material 133 may, for example, comprise a liquid epoxy that is dispensed in a gap between the dies 111 and the wafer 150, e.g., using a dispensing needle or other suitable dispensing tool, and then cured to harden. As illustrated in FIG. 1A, the underfill material 133 fills the gap between the dies 111 and the wafer 150, and may also fill gaps between sidewalls of the dies 111.

Next, a molding material 135 is formed over the wafer 150 and around the dies 111. The molding material 135 also surrounds the underfill material 133. The molding material 135 may comprise an epoxy, an organic polymer, a polymer with or without a silica-based filler or glass filler added, or other materials, as examples. In some embodiments, the molding material 135 comprises a liquid molding compound (LMC) that is a gel type liquid when applied. The molding material 135 may also comprise a liquid or solid when applied. Alternatively, the molding material 135 may comprise other insulating and/or encapsulating materials. The molding material 135 is applied using a wafer level molding process in some embodiments. The molding material 135 may be molded using, for example, compressive molding, transfer molding, molded underfill (MUF), or other methods.

Next, the molding material 135 is cured using a curing process, in some embodiments. The curing process may comprise heating the molding material 135 to a predetermined temperature for a predetermined period of time, using an anneal process or other heating process. The curing process may also comprise an ultra-violet (UV) light exposure process, an infrared (IR) energy exposure process, combinations thereof, or a combination thereof with a heating process. Alternatively, the molding material 135 may be cured using other methods. In some embodiments, a curing process is not included.

After the molding material 135 is formed, a planarization process, such as chemical and mechanical planarization (CMP), may be performed to remove excess portions of the molding material 135 from over the dies 111, such that the molding material 135 and the dies 111 have a coplanar upper surface. As illustrated in FIG. 1A, the molding material 135 is conterminous with the substrate 123 of the wafer 150, such that sidewalls of the molding material 135 are vertically aligned with respective sidewalls of the wafer 150.

FIG. 1B illustrates a top view of the semiconductor device 100 of FIG. 1A, in an embodiment. FIG. 1A illustrates the cross-sectional view of the semiconductor device 100 along cross-section A-A in FIG. 1B. For simplicity, not all features are illustrated in FIG. 1B. For example, the underfill material 133 is not illustrated in FIG. 1B. As illustrated in the top view of FIG. 1B, the die 111A is positioned in a center region of the semiconductor device 100. A plurality of dies 111B and 111C, which are smaller than the die 111A, are positioned on opposing sides of the die 111A. FIG. 1B also illustrates the molding material 135 around the dies 111A/111B/111C. In the top view of FIG. 1B, the semiconductor device 100 has a first dimension W1 and a second dimension H1, which dimensions are measured between opposing sidewalls of the molding material 135.

Figure 2:
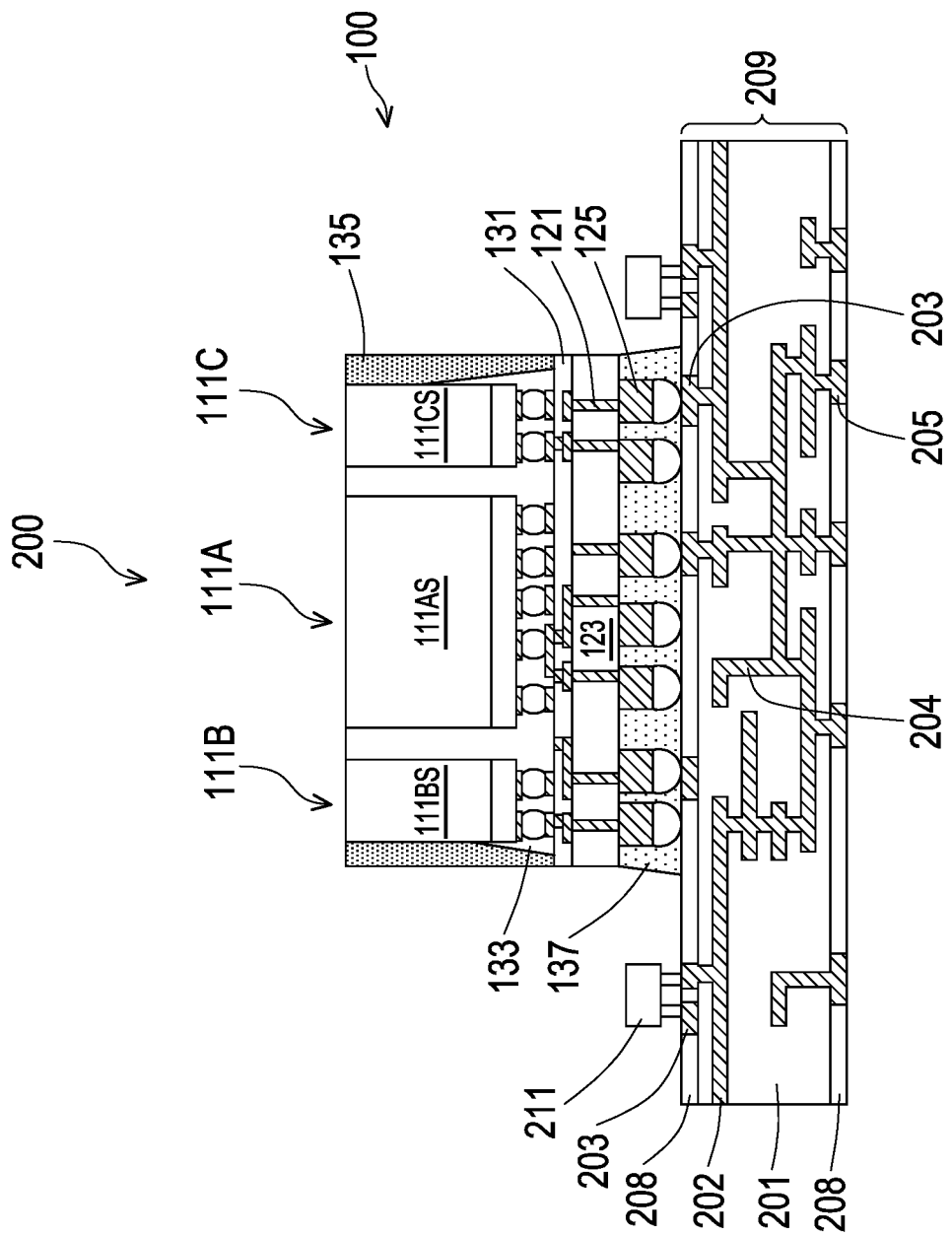
FIGS. 2, 3A-3E, and 4-7 illustrate various views of a semiconductor device at various stages of fabrication, in accordance with an embodiment.

FIGS. 2, 3A-3E, and 4-7 illustrate various views of a semiconductor device 200 at various stages of fabrication, in accordance with an embodiment. As illustrated in FIG. 2, the semiconductor device 100 of FIG. 1A is bonded to an upper surface of a substrate 209 (e.g., a printed circuit board) to form the semiconductor device 200, which has a Chip-on-Wafer-on-Substrate structure. FIG. 2 also illustrates passive components 211 attached to the upper surface of the substrate 209.

In some embodiments, the substrate 209 is a multiple-layer circuit board such as a printed circuit board (PCB). For example, the substrate 209 may include one or more dielectric layers 201 formed of bismaleimide triazine (BT) resin, FR-4 (a composite material composed of woven fiberglass cloth with an epoxy resin binder that is flame resistant), ceramic, glass, plastic, tape, film, or other supporting materials. The substrate 209 may include electrically conductive features (e.g., conductive lines 202 and vias 204) formed in/on the substrate 209. As illustrated in FIG. 2, solder resist layers 208 are formed on the upper and lower surfaces of the substrate 209. In addition, the substrate 209 has conductive pads 203 formed on the upper surface of the substrate 209, and conductive pads 205 formed on the lower surface of the substrate 209, which conductive pads 203 and 205 are electrically coupled to the conductive features of the substrate 209.

In FIG. 2, the semiconductor device 100 is bonded to the conductive pads 203 of the substrate 209. A reflow process may be performed to electrically and mechanically couple the external connectors 125 of the semiconductor device 100 to the conductive pads 203 of the substrate 209. An underfill material 137 is formed to fill the gap between the semiconductor device 100 and the substrate 209. The underfill material 137 may be same as or similar to the underfill material 133, thus details are not repeated here.

FIG. 2 also illustrates passive components 211 attached to the upper surface of the substrate 209 adjacent to the semiconductor device 100. The passive components 211 may be, e.g., discrete components such as capacitors, inductors, resistors, or the like. Contact terminals of the passive components 211 are bonded to the conductive pads 203. The passive components 211 are attached to the substrate 209 before the semiconductor device 100 is attached to the substrate 209, in some embodiments. In other embodiments, the passive components 211 are attached to the substrate 209 after the semiconductor device 100 is attached to the substrate 209.

Figure 3A:
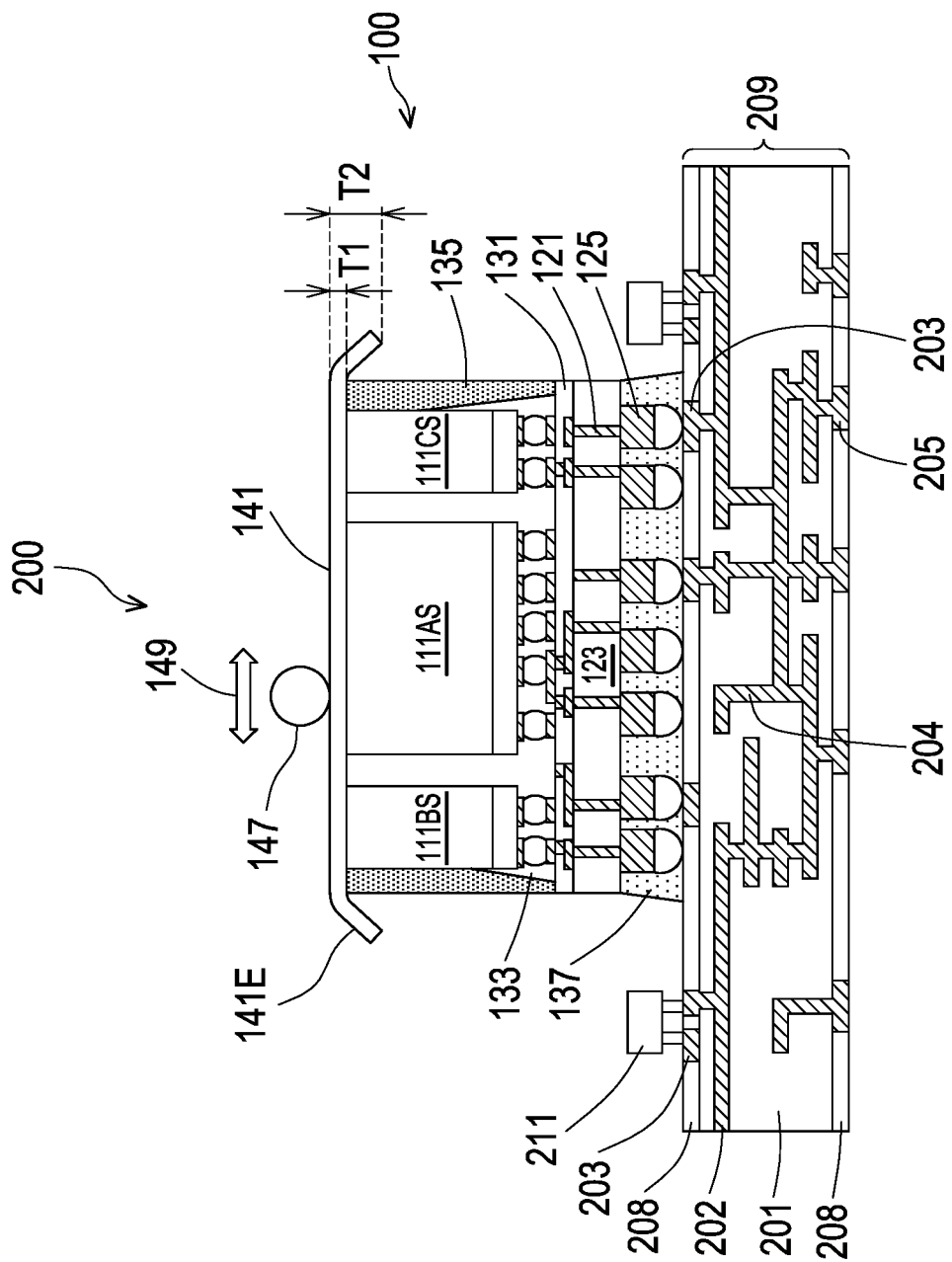

Next, referring to FIG. 3A, a thermal interface material (TIM) film 141 is placed (e.g., laminated) on the upper surface of the semiconductor device 100, e.g., on the upper surface of the dies 11 and on the upper surface of the molding material 135. The TIM film 141 is pre-made before being placed on the semiconductor device 100. For example, the TIM film 141 is pre-made as a sheet (e.g., in a sheet format like a piece of paper) before being placed on the semiconductor device 100.

In some embodiments, the TIM film 141 is formed of a material that is a mixture of carbon and a polymer, where the polymer may be, e.g., a resin-based polymer or an acrylic-based polymer. In some embodiments, a weight percentage of carbon in the material of the TIM film 141 is between about 40% and about 90%. In some embodiments, the thermal conductivity of the TIM film 141 is between about 20 watts per meter-kelvin ((W/(m·K)) and about 80 (W/(m·K)) such as 23 (W/(m·K)) or 56 W/(m·K). The range of the above disclosed weight percentage of carbon is chosen to ensure that the physical properties of the TIM film 141 meet performance requirements. For example, if the carbon percentage is below about 40%, then the thermal conductivity of the TIM film 141 may be too low (e.g., <20 (W/(m·K)). Conversely, if the carbon percentage is above about 90%, then the elasticity and/or adhesiveness of the TIM film 141 may be too low. A thickness of the TIM film 141 may be in a range between about 0.09 mm and about 0.13 mm, as an example. Although a mixture of carbon and a polymer is used as an example above, other suitable materials, such as graphite, graphene, acrylic, resin, gallium, indium, solder, combinations therefore, or the like, may also be used to form the TIM film 141.

As illustrated in FIG. 3A, the TIM film 141 covers (e.g., completely covers) the upper surface of the semiconductor device 100 (e.g., the Chip-on-Wafer structure). A peripheral portion 141E of the TIM film 141 (also referred to as an edge portion) extends laterally beyond lateral extents of the semiconductor device 100. In other words, the peripheral portion 141E of the TIM film 141 extends laterally beyond sidewalls of the semiconductor device 100 (e.g., beyond sidewalls of the molding material 135).

Figure 4:
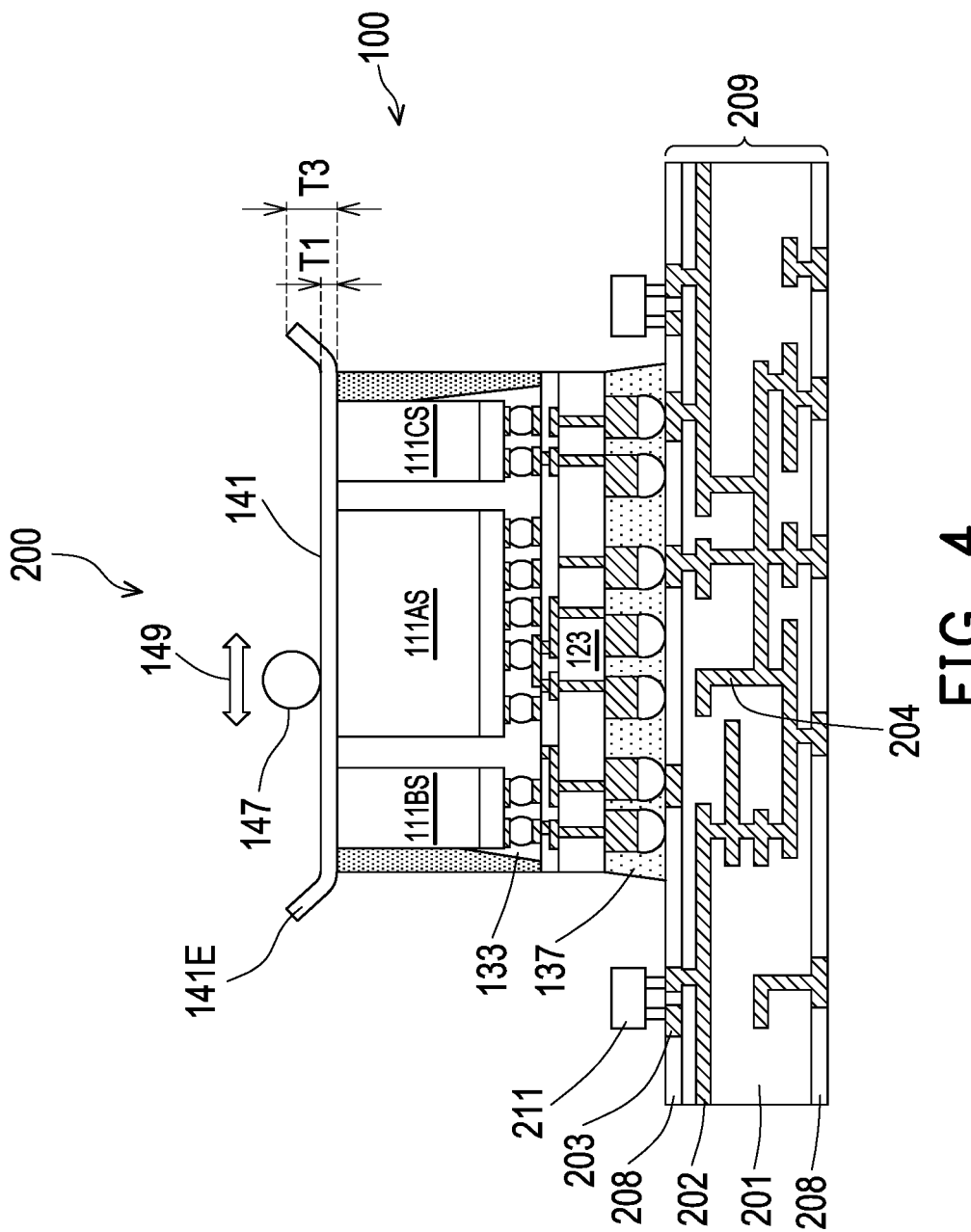

After the TIM film 141 is placed on the upper surface of the semiconductor device 100, the peripheral portion 141E of the TIM film 141 may droop below the upper surface of the molding material 135, as illustrated in FIG. 3A, or may extend above the upper surface of the molding material 135, as illustrated in FIG. 4. In FIG. 3A, the peripheral portion 141E of the TIM film 141 has a dimension T2 (e.g., height) that is larger than a thickness T1 of the TIM film 141. Similarly, in FIG. 4, the peripheral portion 141E of the TIM film 141 has a dimension T3 (e.g., height) that is larger than the thickness T1 of the TIM film 141. Having the peripheral portion 141E of the TIM film 141 extending beyond boundaries (e.g., sidewalls) of the semiconductor device 100 ensures that after the TIM film 141 is cured in subsequent processing, the upper surface of the semiconductor device 100 is still completely covered or almost completely covered (e.g., over 99% of the upper surface area of the semiconductor device 100 is covered) by the cured TIM film 141. Note that although the TIM film 141 is illustrated as a single layer in the figures, the TIM film 141 may include multiple sub-layers laminated together. In addition, or alternatively, a plurality of the TIM film 141 may be stacked together over the upper surface of the semiconductor device 100 to achieve a desired total thickness.

Still referring to FIG. 3A, after the TIM film 141 is placed on the semiconductor device 100, the TIM film 141 is pressed against the upper surface of the semiconductor device 100 by rolling a roller 147 on the TIM film 141, e.g., along the directions of the arrow 149 in FIG. 3A. The pressing of the roller 147 ensures that the TIM film 141 is in firm contact with the upper surface of the semiconductor device 100, such that there is no gap (e.g., air bubble) between the TIM film 141 and the upper surface of the semiconductor device 100. In other words, the contact area between the TIM film 141 and the semiconductor device 100 is maximized, which improves the efficiency of heat transfer (e.g., heat dissipation) from the semiconductor device 100 to the TIM film 141.

Figure 3C:
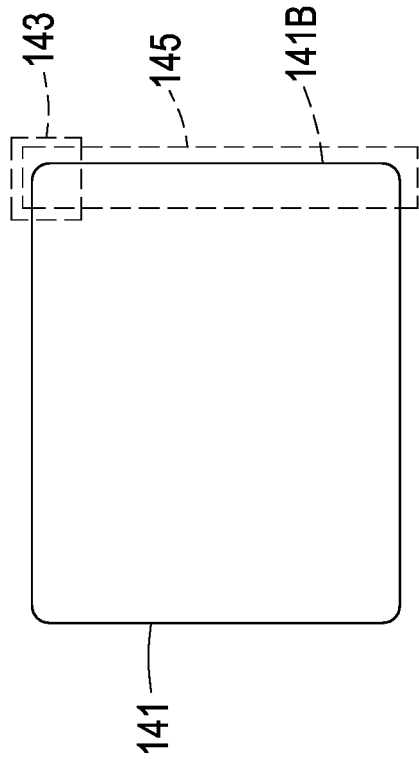
Figure 3E:
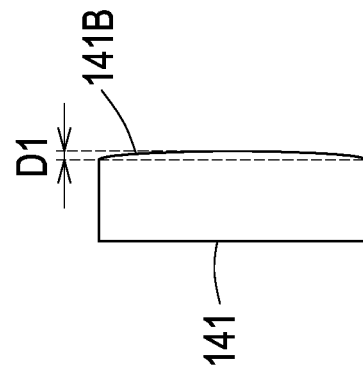
Figure 3B:
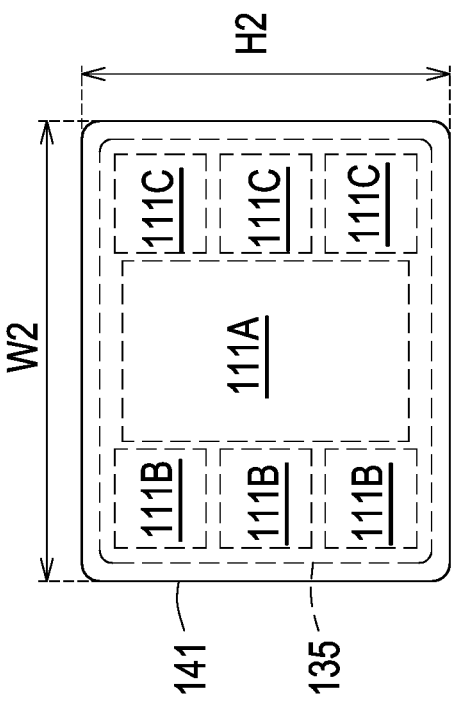

FIGS. 3B and 3C illustrate the top view of the semiconductor device 200 of FIG. 3A. Note that for simplicity, not all features of the semiconductor device 200 are illustrated. In FIG. 3B, besides the TIM film 141, the dies 111 (e.g., 111A, 111B, and 111C) and the molding material 135 are shown in phantom, whereas in FIG. 3C, only the TIM film 141 is shown. As illustrated in the top view of FIG. 3B, the dimensions W2 and H2 of the TIM film 141 are larger than the dimensions W1 and H1 (see FIG. 1B) of the semiconductor device 100 (e.g., W2>W1, H2>H1), such that the TIM film 141 completely covers the upper surface of the semiconductor device 100. In other words, in the top view, the semiconductor device 100 is disposed completely within the boundaries of the TIM film 141.

Figure 3D:

FIG. 3D shows a zoomed-in view of an area 143 of the TIM film 141 in FIG. 3C, in an embodiment. The area 143 is a corner area of the TIM film 141. A radius R1 of the corner area may be smaller than about 0.2 mm, as an example. FIG. 3E shows a zoomed-in view of an area 145 of the TIM film 141 in FIG. 3C, in an embodiment. The area 145 is an edge area of the TIM film 141 with a boundary 141B (e.g., an edge) of the TIM film 141. In the illustrated embodiment of FIG. 3E, the boundary 141B of the TIM film 141 is not a perfect straight line, and may be, e.g., a curved line that has a maximum lateral offset D1 that is less than about 1 mm, as an example. Since the round corner or curved boundary of the TIM material may cause some areas of the underling semiconductor device 100 to be exposed (e.g., not covered), the small radius R1 and the small maximum lateral offset D1 discussed above, which are made possible by the TIM film 141, improve the coverage ratio of the upper surface of the semiconductor device 100.

Compared with a reference method where a gel type (or a liquid type) TIM material is deposited on the upper surface of the semiconductor device 100, the presently disclosed methods offer multiple advantages. For example, the gel type TIM material typically has a low thermal conductivity, such as below 3 W/(m·K). In contrast, the TIM film 141 has a much higher thermal conductivity (e.g., larger than 20 (W/(m·K)) for improved heat dissipation. The gel type TIM material typically needs to be stored at a lower temperature (e.g., −40° C.), whereas the TIM film 141 may be stored at room temperature. To reduce voids (e.g., air bubbles) in the cured gel type TIM material (or between the cured gel type TIM material and the semiconductor device 100), the gel type TIM material may have to be deposited in special patterns. Even with special patterns, voids may still be formed in the cured gel type TIM material. In contrast, no special pattern needs to be designed for the TIM film 141, and no void (e.g., air bubble) is formed using the disclosed embodiments herein.

Furthermore, the shape and the dimensions of the deposited gel type TIM material is difficult to control, which often leads to low coverage ratio (e.g., a ratio between areas covered by the TIM material and areas without the TIM material) of the upper surface of the semiconductor device 100, because certain regions of the upper surface of the semiconductor device 100 may not have the gel type TIM material deposited. As a result, the coverage ratio using the gel type TIM material is typically between about 80% and about 90%. In contrast, the TIM film 141 is pre-formed (e.g., in a sheet format), and may be cut into any suitable shape and/or dimensions and is easily laminated on the upper surface of the semiconductor device 100. As a result, after being cured, the TIM film 141 achieves a coverage ratio larger than 99%, which in turn results in improved heat dissipation for the semiconductor device 100. Due to the easiness of laminating the TIM film 141 on the semiconductor device 100, the throughput of the manufacturing process is much higher than that of a process where a gel type TIM material is deposited on the semiconductor device 100.

Figure 5:
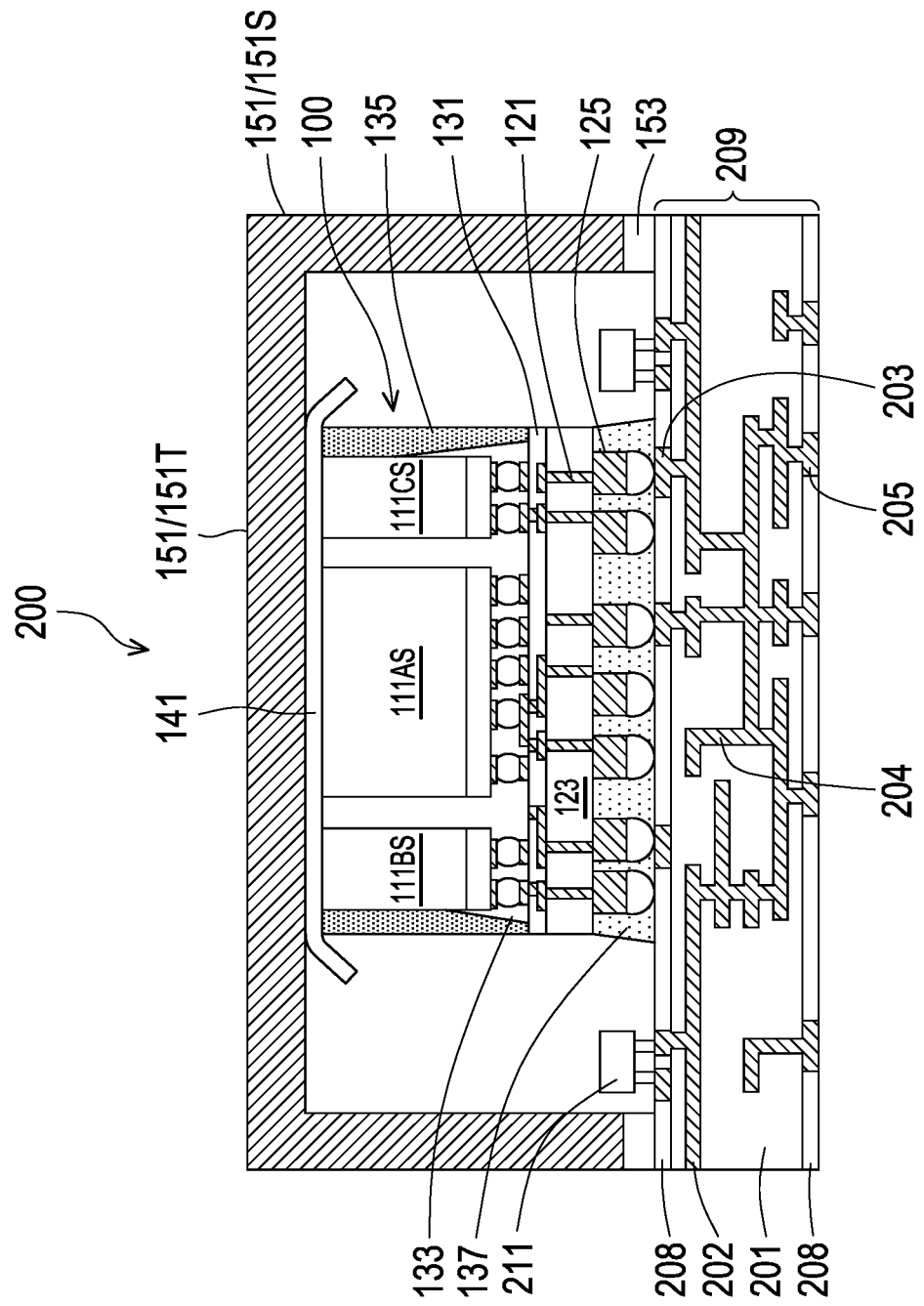

Next, in FIG. 5, a lid 151 is attached to the upper surface of the substrate 209 to form an enclosed space between the lid 151 and the substrate 209. The lid 151 may be formed of a material suitable for heat dissipation, such as copper, aluminum, steel, ceramic, alloy, dielectric materials, or the like. In FIG. 5, the lid 151 has a top 151T and sidewall portions 151S. The sidewall portions 151S are attached by, e.g., a glue 153, to the upper surface of the substrate 209. In an embodiment, the lid 151 is formed of a metal material and is electrically isolated. In another embodiment, the lid 151 is formed of a metal material and is electrically coupled to a conductive pad 203 (e.g., by a solder region) that is configured to be connected to electrical ground, in which case the lid 151 also serves as an electro-magnetic interference (EMI) shield for the semiconductor device 100.

As illustrated in FIG. 5, the semiconductor device 100, the TIM film 141, and the passive components 211 are disposed in the enclosed space between the lid 151 and the substrate 209. The TIM film 141 is disposed between the top 151T of the lid 151 and the upper surface of the semiconductor device 100. In particular, an upper surface of the TIM film 141 contacts (e.g., physically contacts) the top 151T, and a lower surface of the TIM film 141 contacts (e.g., physically contacts) the upper surface of the semiconductor device 100 and the upper surface of the molding material 135.

Figure 6:
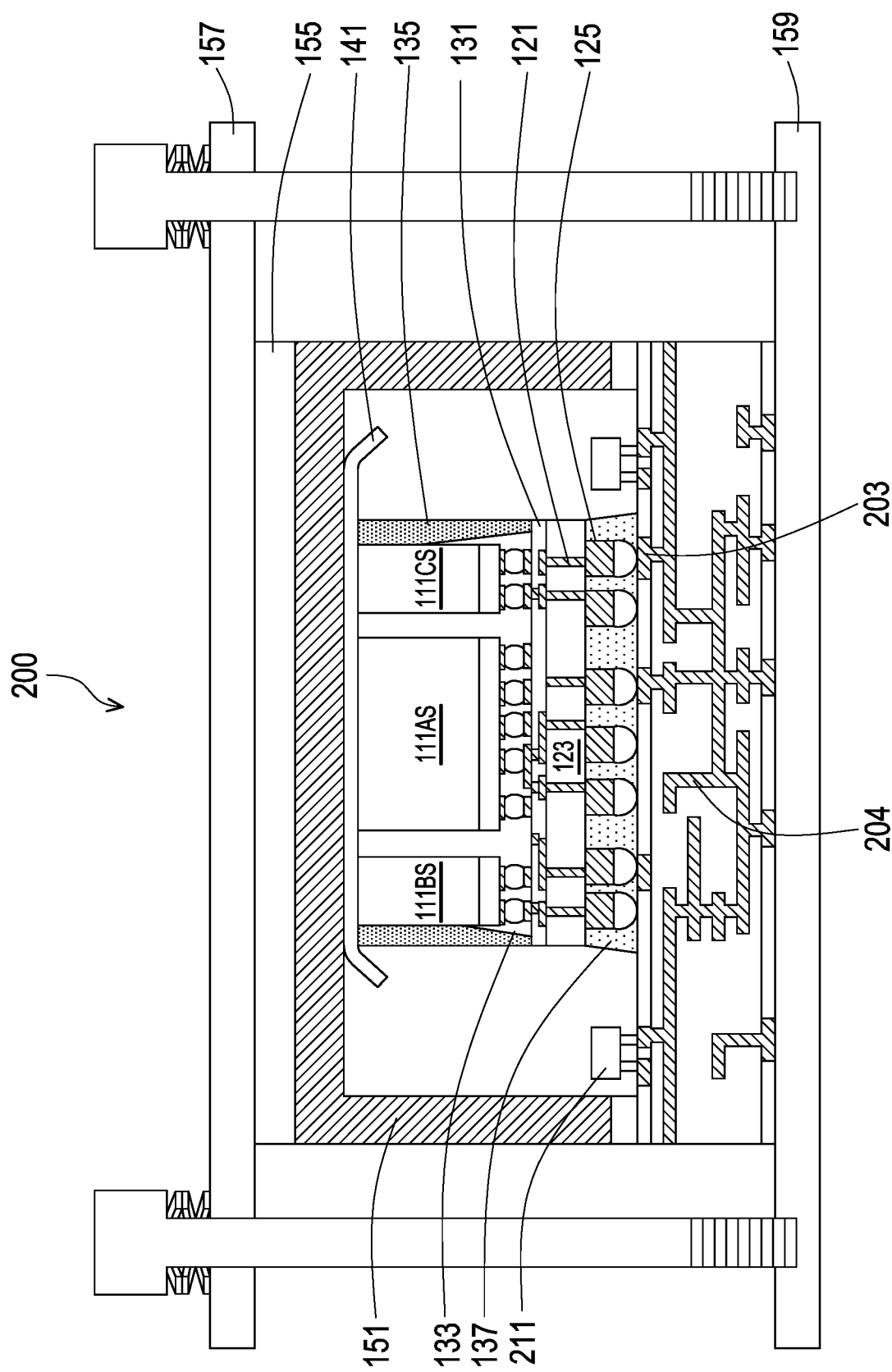

Next, in FIG. 6, the semiconductor device 200 is clamped between a top jig 157 and a bottom jig 159 of a clamp. A rubber pad 155 may be placed between the top jig 157 and the lid 151 to prevent damage to the semiconductor device 200. Next, while being clamped between the top jig 157 and the bottom jig 159, the semiconductor device 200 is heated to a pre-determined temperature (e.g., between 50° C. and 350° C.) for a pre-determined period of time (e.g., between about 50 seconds and about 3 hours). The heating process cures the TIM film 141, and the cured TIM film 141 glues the upper surface of the semiconductor device 100 to the top 151T of the lid 151, in some embodiments.

Figure 7:
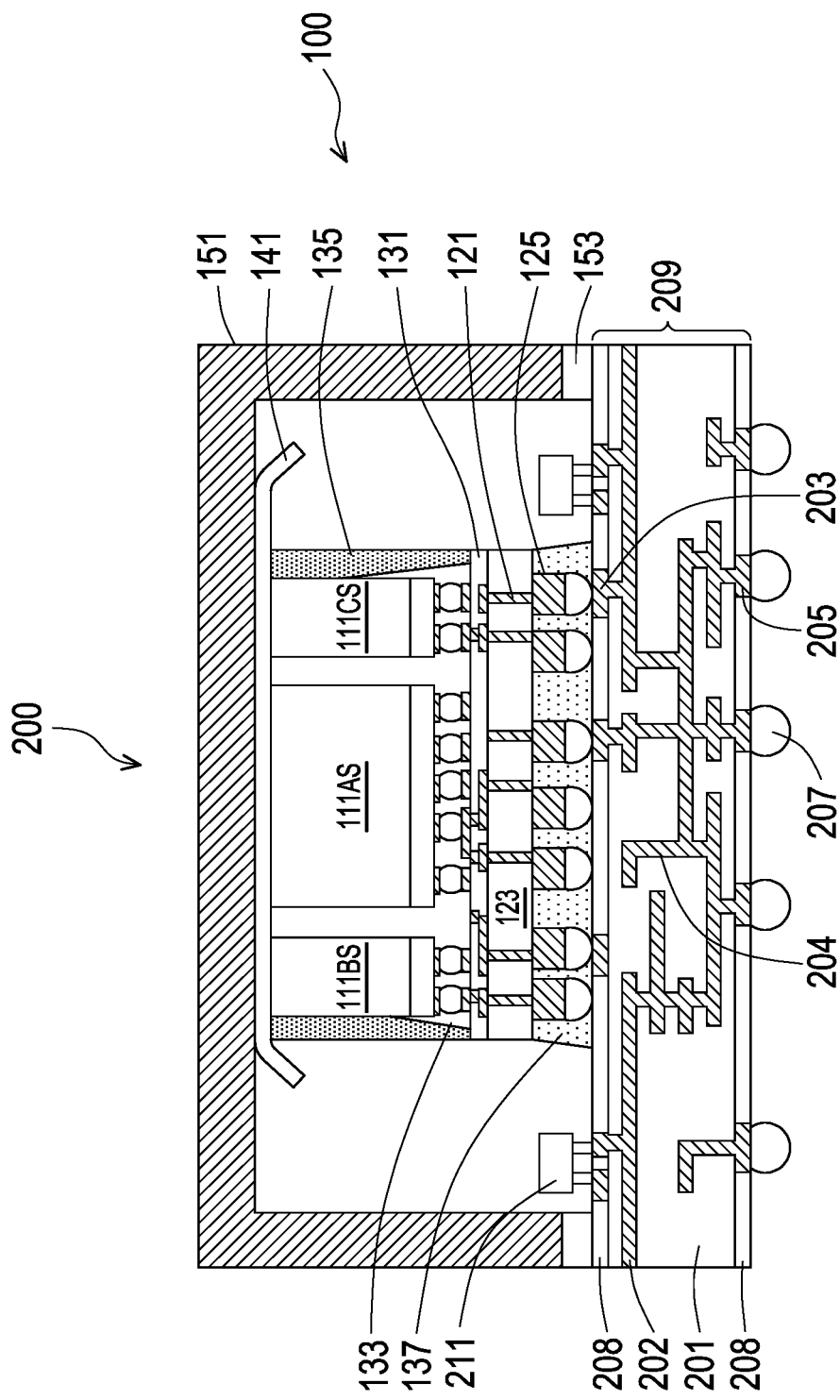

Next, in FIG. 7, the semiconductor device 200 is removed from the clamp, and conductive bumps 207 are formed on the conductive pads 205 at the lower surface of the substrate 209. The conductive bumps 207 may be solder balls, copper pillars, combinations thereof, or the like. Therefore, the semiconductor device 100, the passive components 211, and the conductive bumps 207 are electrically interconnected through the conductive features (e.g., conductive lines or vias) of the substrate 209.

Figure 8:
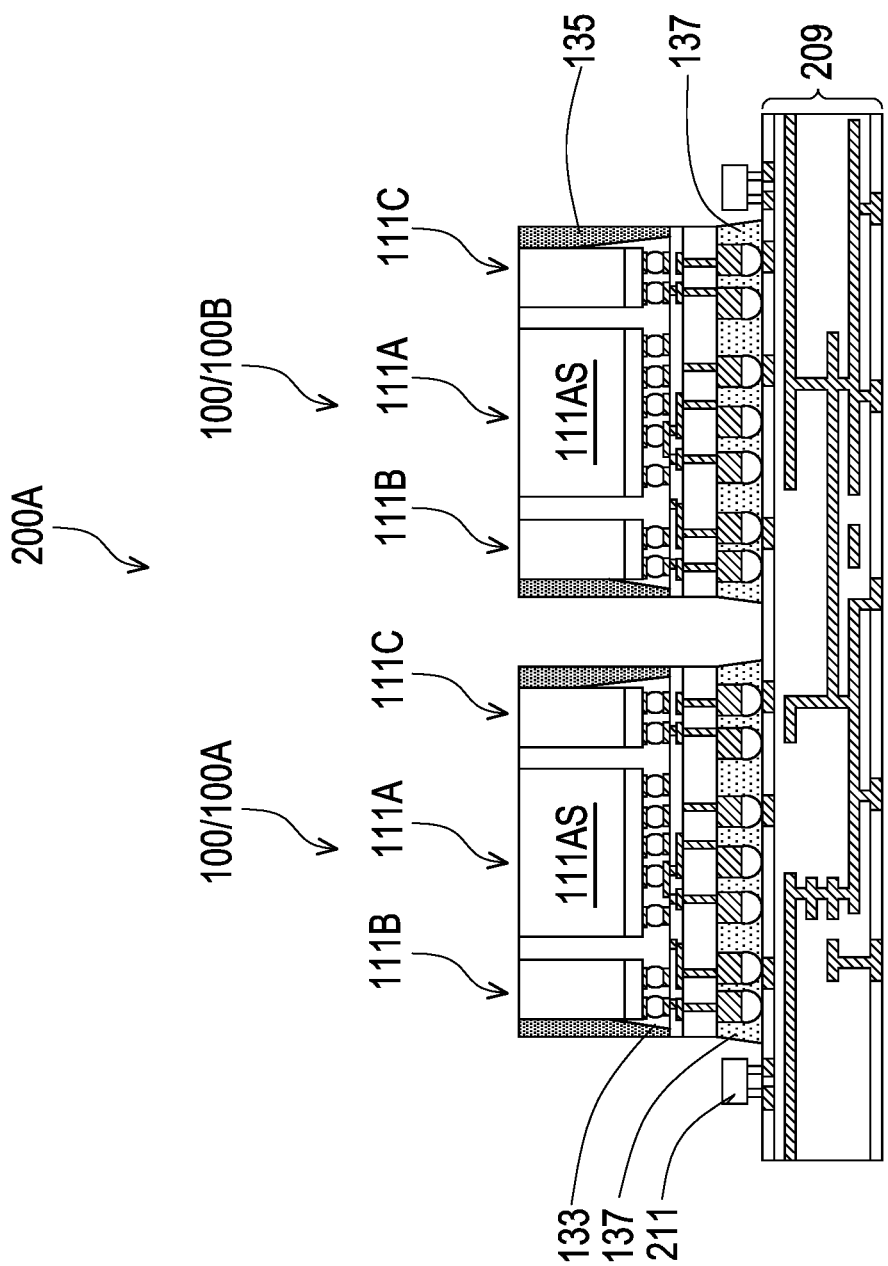
FIGS. 8-11 illustrate cross-sectional views of a semiconductor device at various stages of fabrication, in accordance with another embodiment.

FIGS. 8-11 illustrate cross-sectional views of a semiconductor device 200A at various stages of fabrication, in accordance with another embodiment. The semiconductor device 200A in FIG. 8 is similar to the semiconductor device 200 in FIG. 2, but with two semiconductor devices 100 (e.g., 100A and 100B) attached to the upper surface of the substrate 209. Each of the two semiconductor devices 100 has a Chip-on-Wafer structure same as or similar to the semiconductor device 100 of FIG. 1. Note that although two semiconductor devices 100 are illustrated in FIG. 8, other numbers of semiconductor devices 100, such as three, four, or more, may be attached to the substrate 209, these and other variations are fully intended to be included within the scope of the present disclosure.

Figure 9:
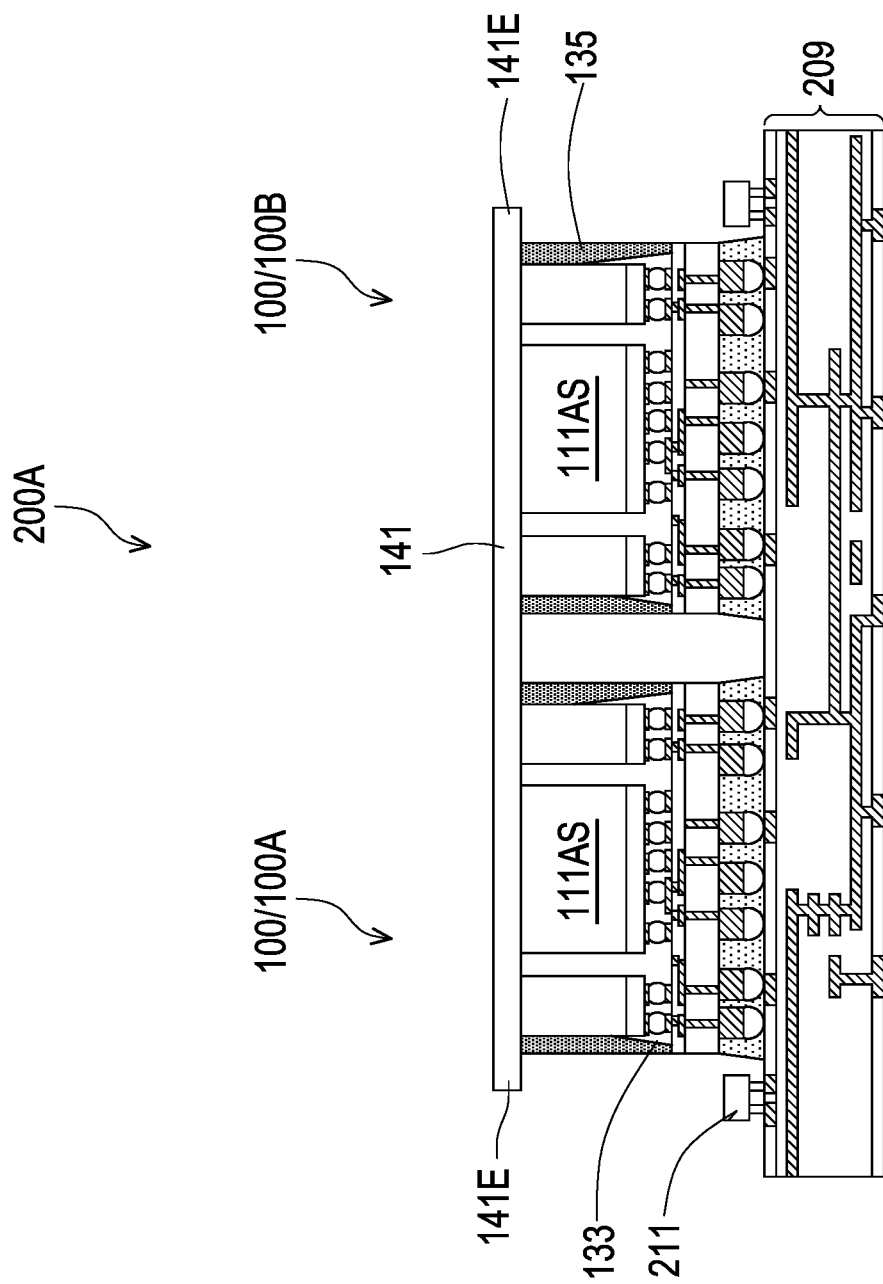

Next, in FIG. 9, the TIM film 141 is placed (e.g., laminated) over the upper surfaces of the semiconductor devices 100A and 100B. Note that in the example of FIG. 9, a single sheet of TIM film 141 is placed on the semiconductor devices 100A and 100B. In other words, the TIM film 141 extends continuously from the semiconductor device 100A to the semiconductor device 100B. Similar to FIGS. 3A-3E, the TIM film 141 completely overs the upper surfaces of the semiconductor devices 100A and 100B, and has edge portions 141E that extend beyond lateral extents (e.g., beyond sidewalls) of the semiconductor devices 100A and 100B.

Figure 10:
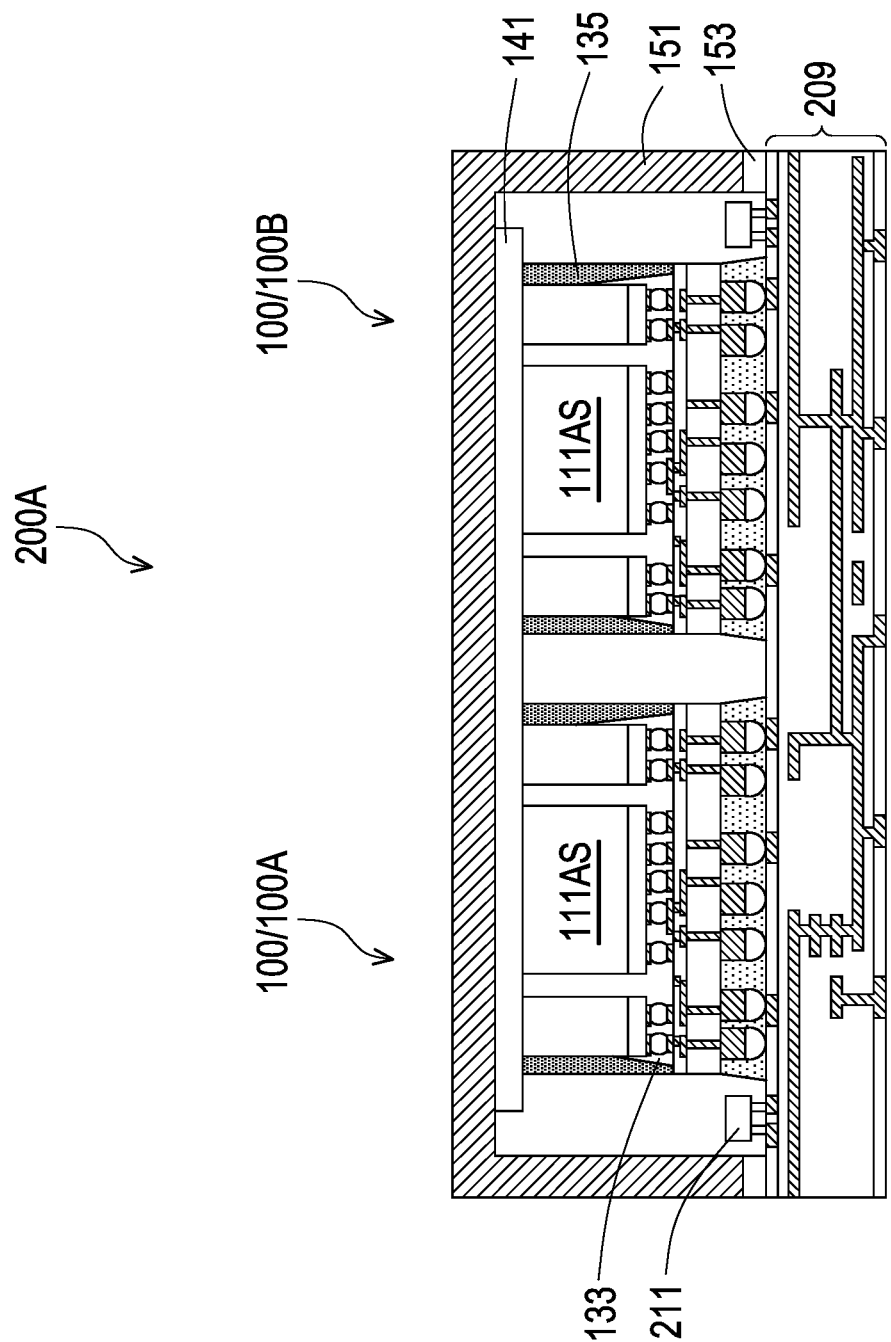

Next, in FIG. 10, the lid 151 is attached to the upper surface of the substrate 209. The semiconductor devices 100A and 100B, the TIM film 141, and the passive components 211 are disposed in the enclosed space between the lid 151 and the substrate 209. The TIM film 141 contacts (e.g., physically contacts) the lid 151 and the semiconductor devices 100A and 100B.

Figure 11:
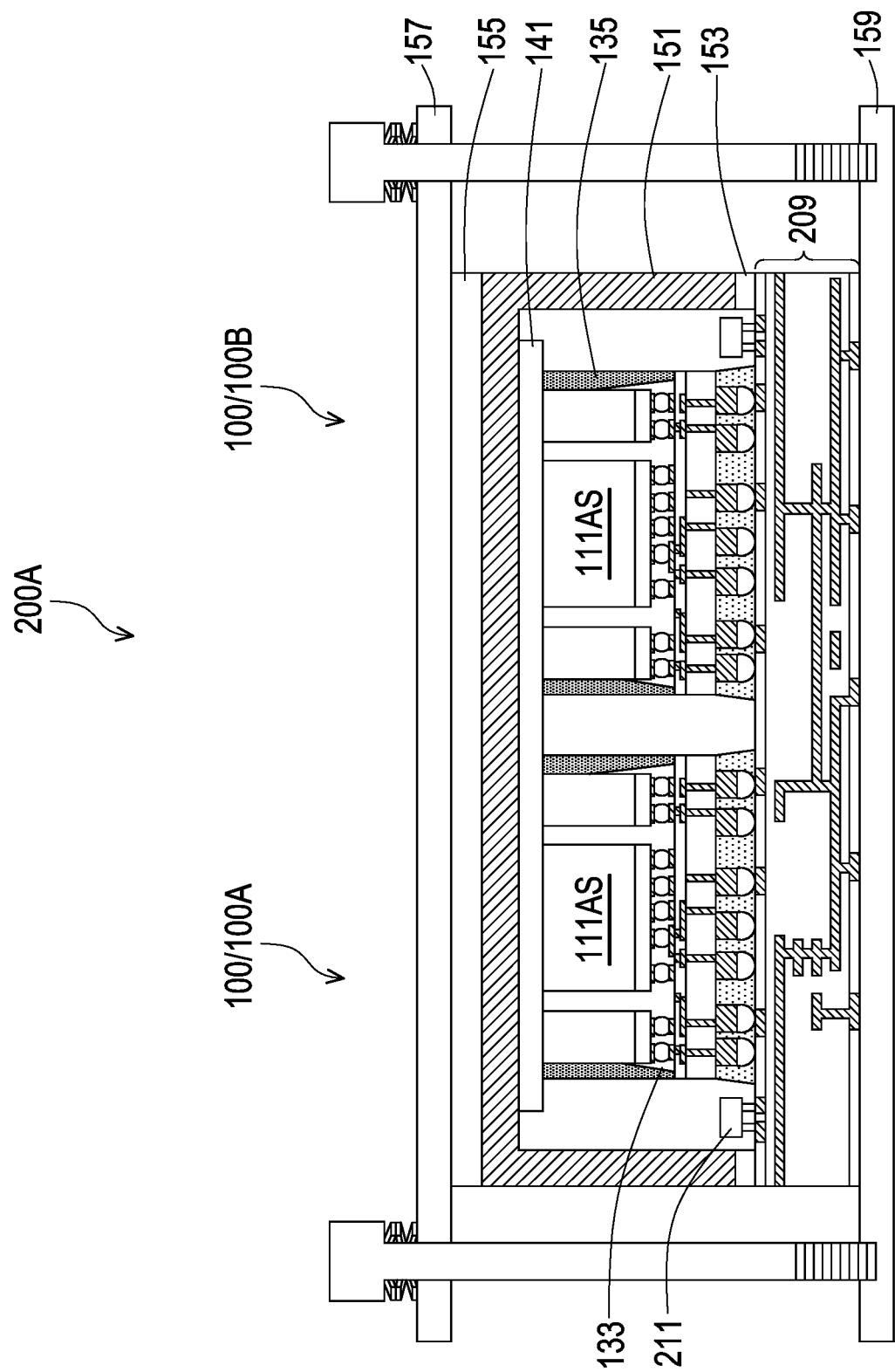

Next, in FIG. 11, the semiconductor device 200A is clamped between the top jig 157 and the bottom jig 159 of a clamp. Next, a heating process is performed to cure the TIM film 141. After the heating process, the semiconductor device 200A is removed from the clamp, and conductive bumps 207 may be formed at the lower surface of the substrate 209. The processing is the same as or similar to that of FIG. 7, thus details are not repeated here.

Figure 12:
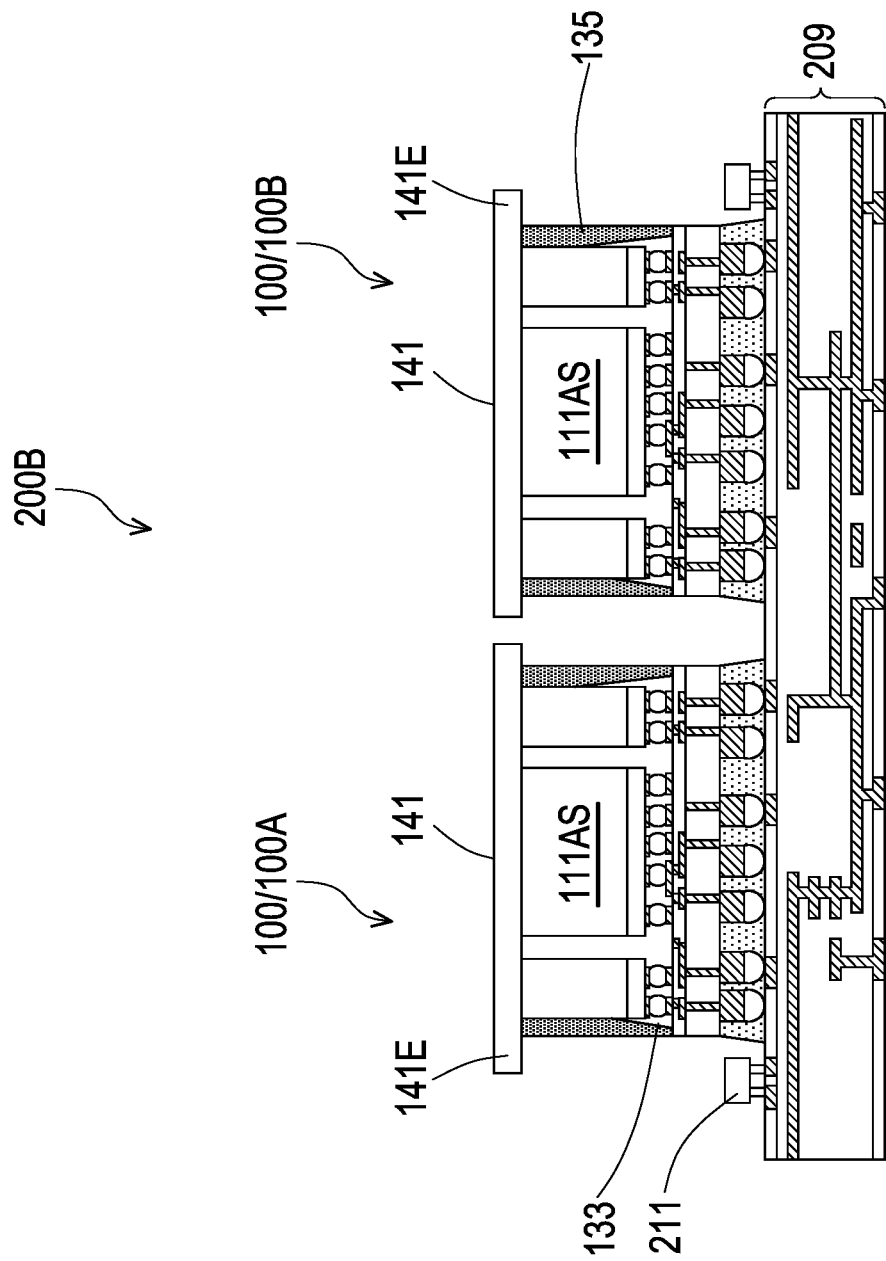
FIGS. 12-14 illustrate cross-sectional views of a semiconductor device at various stages of fabrication, in accordance with another embodiment.
Figure 13:
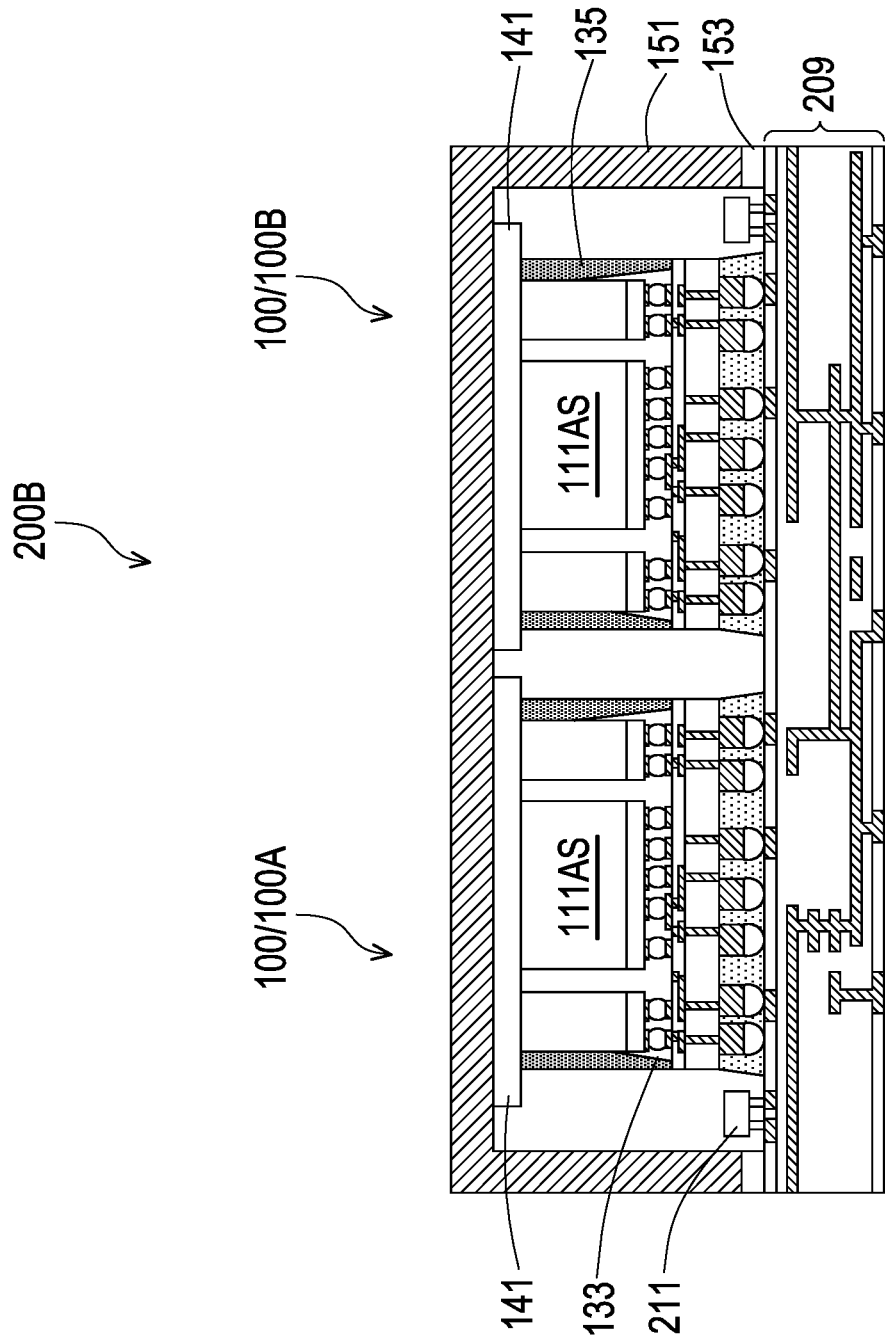
Figure 14:
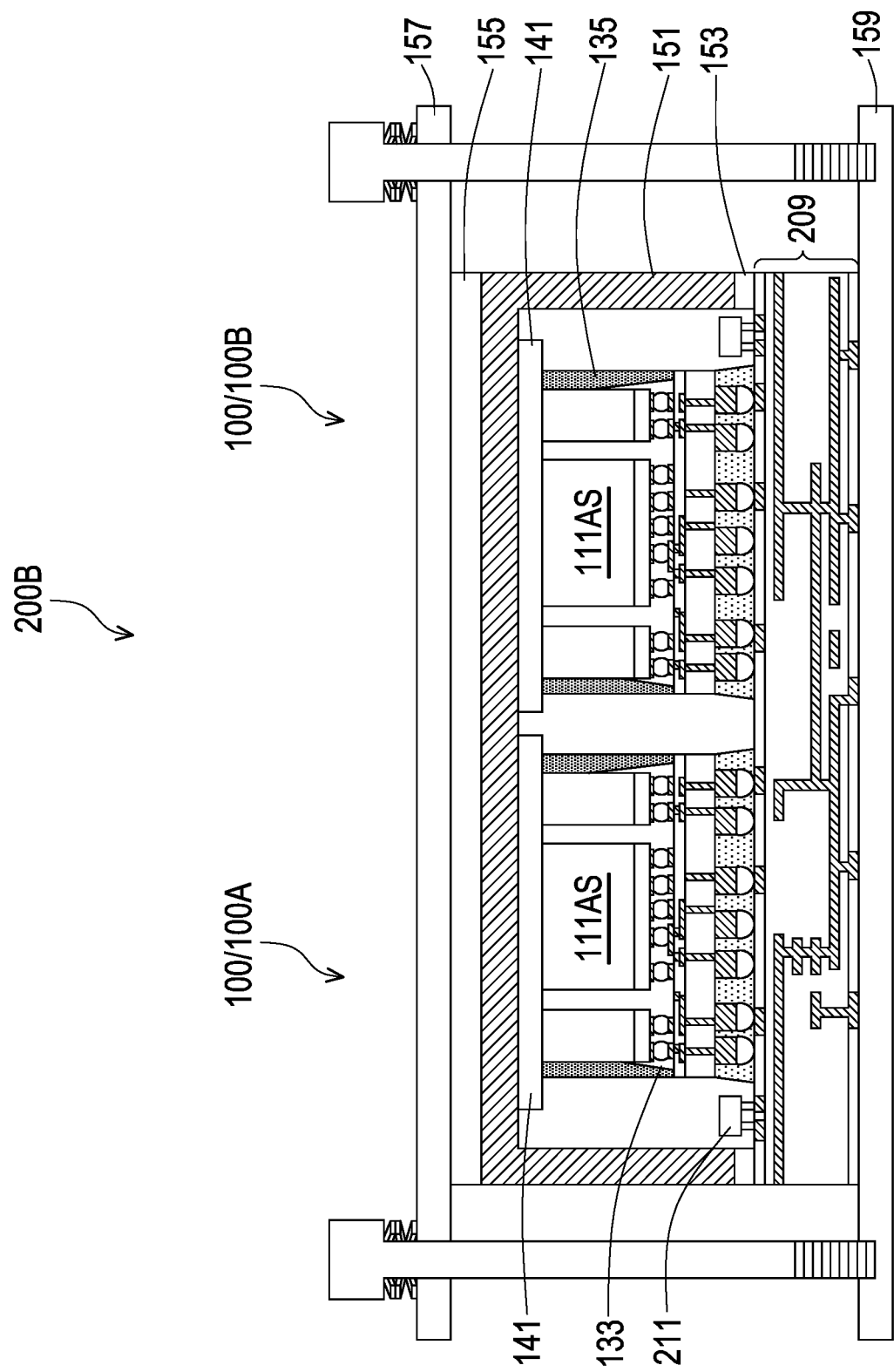

FIGS. 12-14 illustrate cross-sectional views of a semiconductor device 200B at various stages of fabrication, in accordance with another embodiment. The semiconductor device 200B in FIG. 12 is similar to the semiconductor device 200A in FIG. 9, but two separate TIM films 141 are each placed on a respective semiconductor device 100 (e.g., 100A or 100B). The edge portions 141E of each TIM film 141 extends beyond the lateral extents (e.g., beyond sidewalls) of the underlying semiconductor device 100.

Next, in FIG. 13, the lid 151 is attached to the upper surface of the substrate 209. The semiconductor devices 100A and 100B, the TIM films 141, and the passive components 211 are disposed in the enclosed space between the lid 151 and the substrate 209. Each of the TIM films 141 contacts (e.g., physically contacts) the lid 151 and the underlying semiconductor device 100.

Next, in FIG. 14, the semiconductor device 200B is clamped between the top jig 157 and the bottom jig 159 of a clamp. Next, a heating process is performed to cure the TIM films 141. After the heating process, the semiconductor device 200B is removed from the clamp, and conductive bumps 207 may be formed at the lower surface of the substrate 209. The processing is the same as or similar to that of FIG. 7, thus details are not repeated here.

Figure 15:
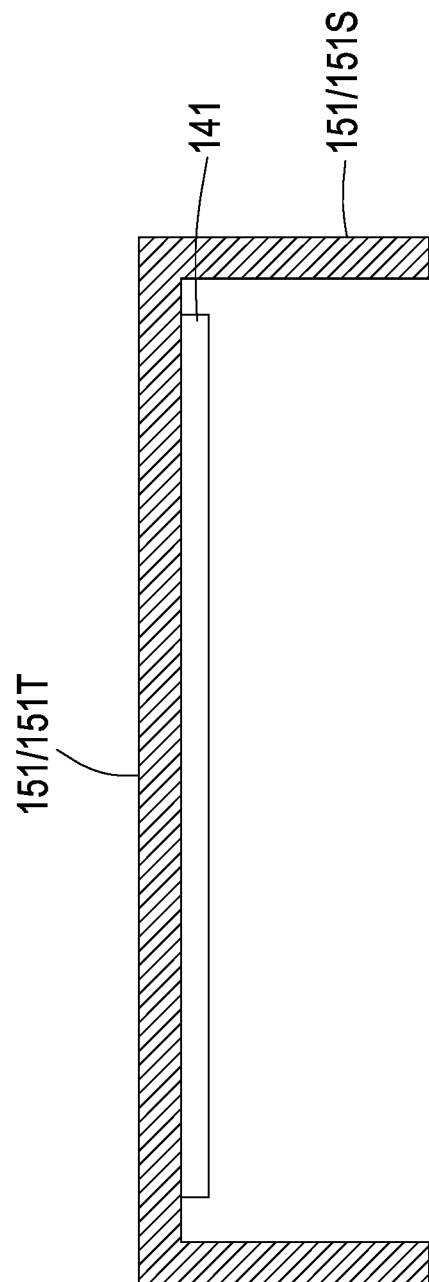
FIGS. 15-17 illustrate cross-sectional views of a semiconductor device at various stages of fabrication, in accordance with yet another embodiment.
Figure 16:
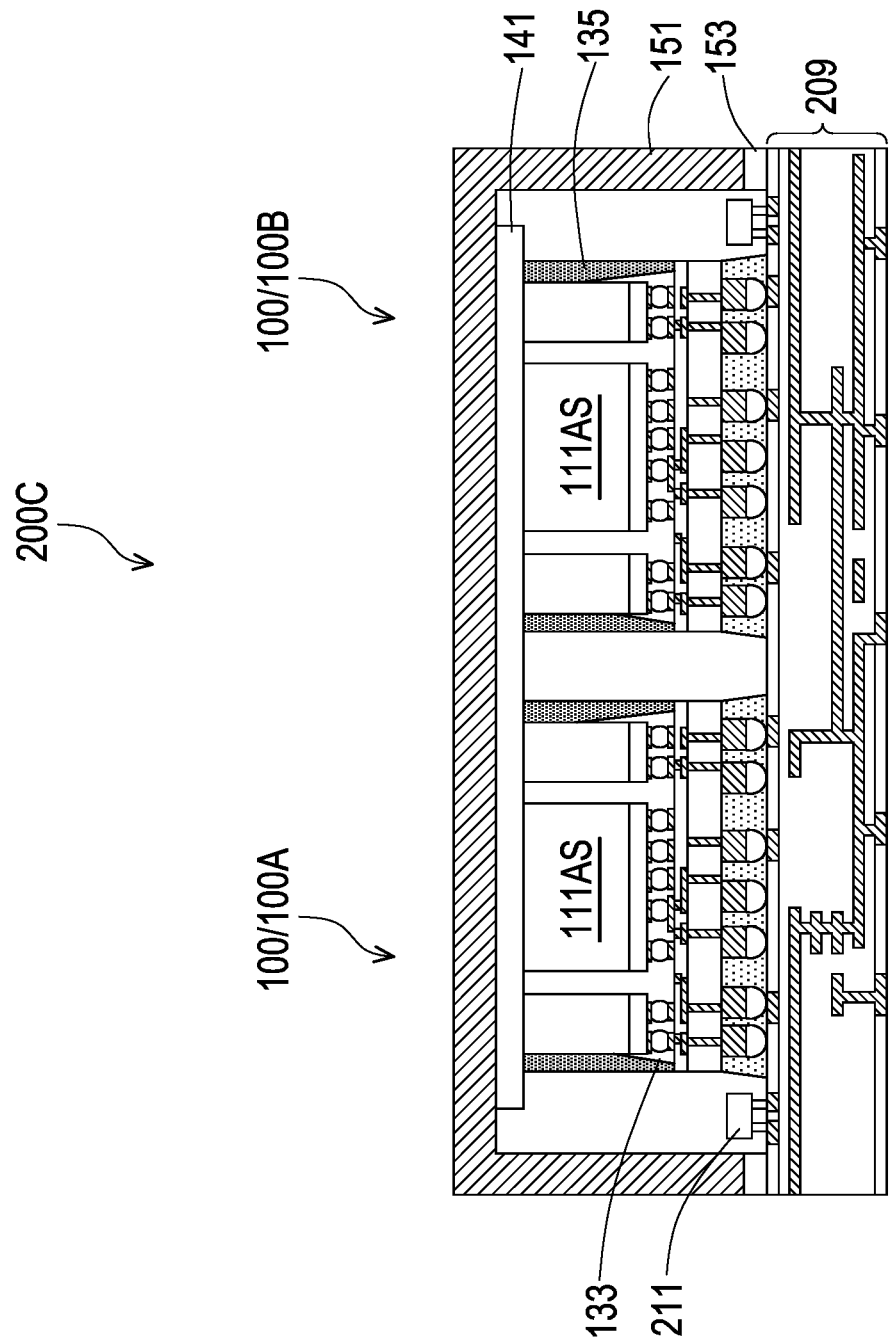
Figure 17:
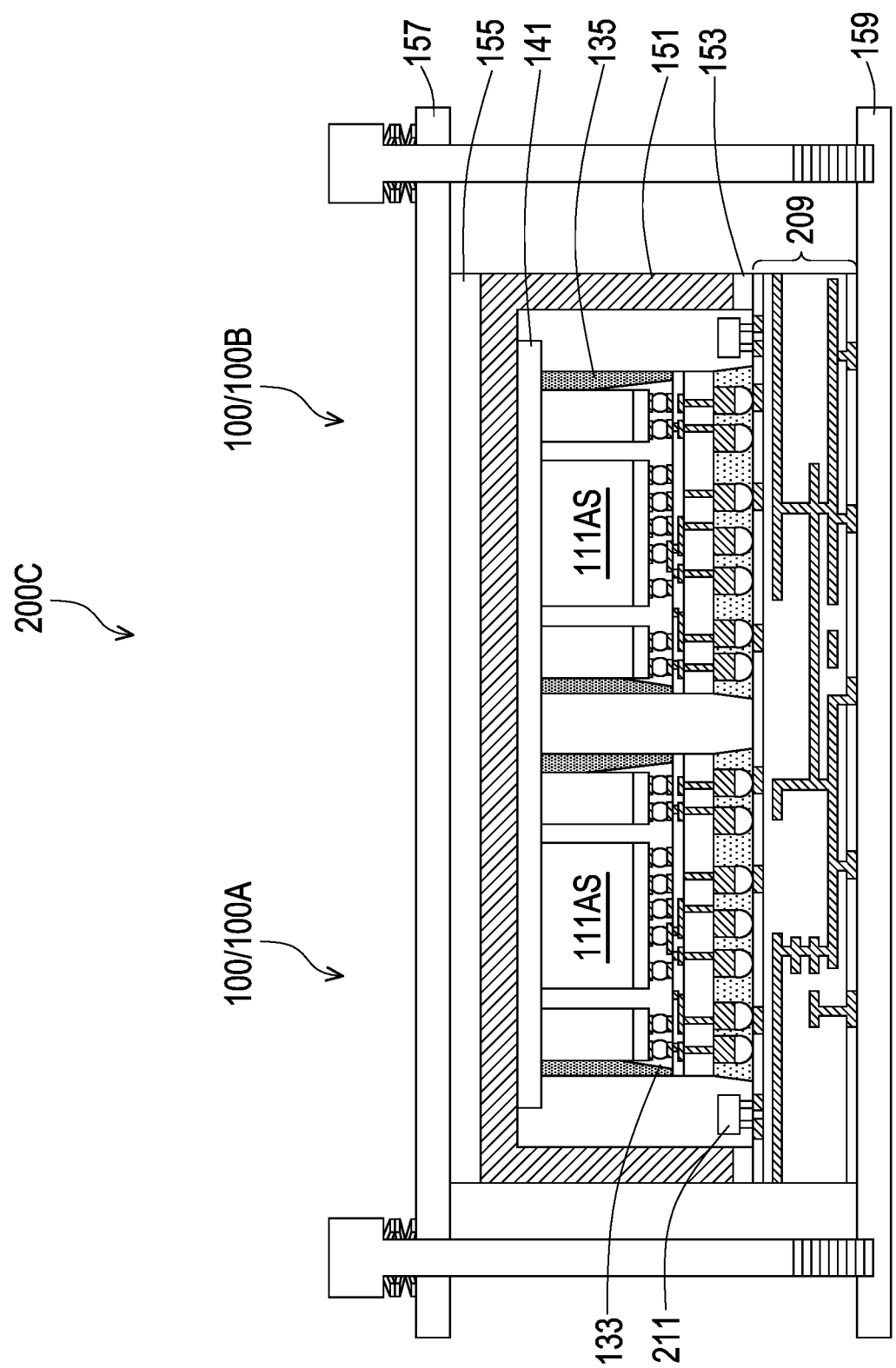

FIGS. 15-17 illustrate cross-sectional views of a semiconductor device 200C at various stages of fabrication, in accordance with yet another embodiment. In FIG. 15, the TIM film 141 is attached to (e.g., laminated) the lower surface of the top 151T of the lid 151.

Next, in FIG. 16, the lid 151, with the TIM film 141 attached, is attached to the upper surface of the substrate 209, e.g., using the glue 153. The semiconductor devices 100A and 100B, the TIM film 141, and the passive components 211 are disposed in the enclosed space between the lid 151 and the substrate 209. The TIM film 141 contacts (e.g., physically contacts) the lid 151 and the underlying semiconductor devices 100. Note that although one TIM film 141 is illustrated in FIG. 16, two TIM films 141 may be used, with each TIM film 141 being placed on a respective semiconductor device 100, same as or similar to FIG. 13.

Next, in FIG. 17, the semiconductor device 200C is clamped between the top jig 157 and the bottom jig 159 of a clamp. Next, a heating process is performed to cure the TIM film 141. After the heating process, the semiconductor device 200C is removed from the clamp, and conductive bumps 207 may be formed at the lower surface of the substrate 209. The processing is the same as or similar to that of FIG. 7, thus details are not repeated here.

Embodiments may achieve advantages. Compared with a gel type TIM material, higher thermal conductivity is achieved for more efficient heat dissipation using the TIM film 141. For example, compared with a gel type TIM material, the disclosed methods using the TIM film 141 achieve 50% or more improvement in heat dissipation efficiency. The shape and the thickness of the TIM film 141 can be easily controlled to achieve an excellent coverage ratio of more than 99% for the upper surface of the semiconductor device 100 after the TIM film 141 is cured. The void issue (e.g., air bubble) caused by using traditional gel type TIM material is avoided. Since the TIM film 141 is pre-made, it is easily used in the manufacturing process to achieve higher throughput than gel type or liquid type TIM materials.

Figure 18:
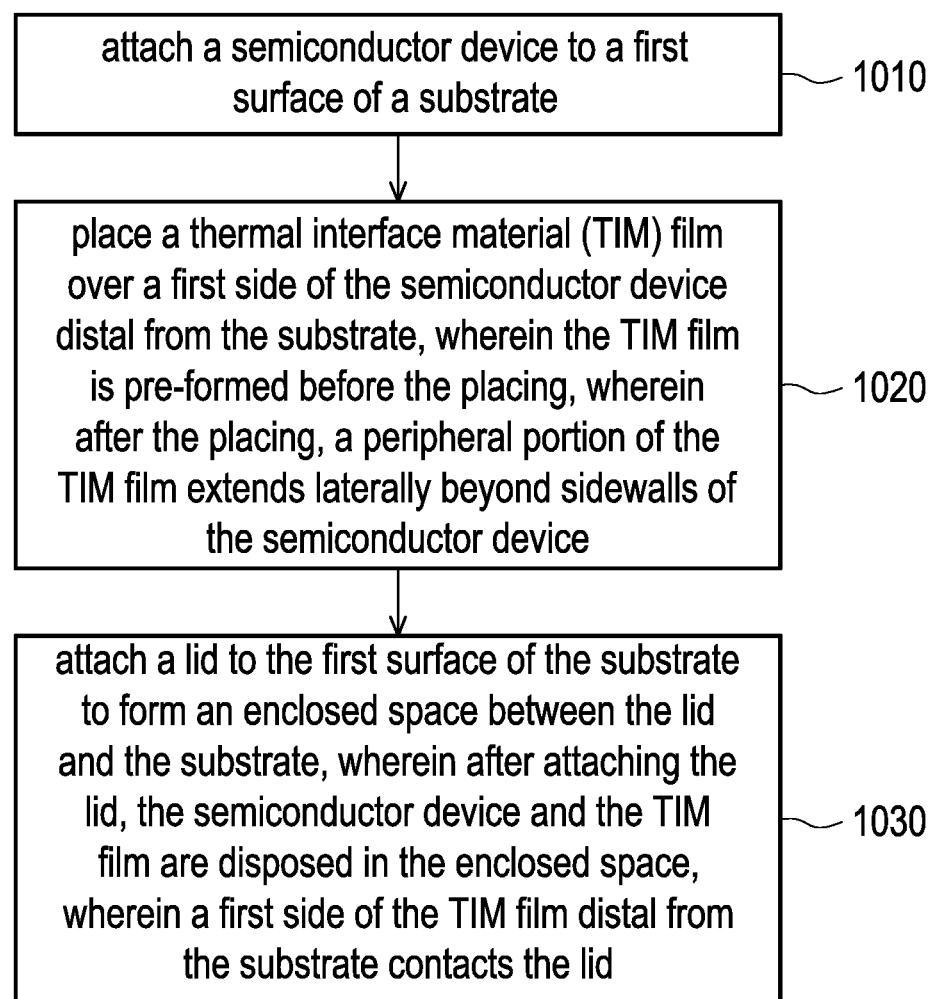
FIG. 18 illustrates a flow chart of a method of forming a semiconductor structure, in some embodiments.

FIG. 18 illustrates a flow chart 1000 of a method of forming a semiconductor structure, in some embodiments. It should be understood that the embodiment method shown in FIG. 18 is merely an example of many possible embodiment methods. One of ordinary skill in the art would recognize many variations, alternatives, and modifications. For example, various steps as illustrated in FIG. 18 may be added, removed, replaced, rearranged and repeated.

Referring to FIG. 18, at block 1010, a semiconductor device is attached to a first surface of a substrate. At block 1020, a thermal interface material (TIM) film is placed over a first side of the semiconductor device distal from the substrate, wherein the TIM film is pre-formed before the placing, wherein after the placing, a peripheral portion of the TIM film extends laterally beyond sidewalls of the semiconductor device. At block 1030, a lid is attached to the first surface of the substrate to form an enclosed space between the lid and the substrate, wherein after attaching the lid, the semiconductor device and the TIM film are disposed in the enclosed space, wherein a first side of the TIM film distal from the substrate contacts the lid.

In accordance with an embodiment, a method of forming a semiconductor structure includes: attaching a semiconductor device to a first surface of a substrate; placing a thermal interface material (TIM) film over a first side of the semiconductor device distal from the substrate, wherein the TIM film is pre-formed before the placing, wherein after the placing, a peripheral portion of the TIM film extends laterally beyond sidewalls of the semiconductor device; and attaching a lid to the first surface of the substrate to form an enclosed space between the lid and the substrate, wherein after attaching the lid, the semiconductor device and the TIM film are disposed in the enclosed space, wherein a first side of the TIM film distal from the substrate contacts the lid. In an embodiment, after attaching the lid, a second side of the TIM film facing the substrate contacts the first side of the semiconductor device. In an embodiment, the method further includes, before placing the TIM film, surrounding the semiconductor device with a molding material, wherein after placing the TIM film, the peripheral portion of the TIM film extends laterally beyond sidewalls of the molding material. In an embodiment, the second side of the TIM film further contacts a top surface of the molding material distal from the substrate. In an embodiment, attaching the lid is performed after placing the TIM film, wherein the method further comprises, after placing the TIM film and before attaching the lid: pressing the TIM film against the first side of the semiconductor device using a roller. In an embodiment, the method further includes: before attaching the lid, attaching the TIM film to an interior surface of the lid between opposing inner sidewalls of the lid, wherein attaching the lid to the first surface of the substrate causes the TIM film to be placed on the first side of the semiconductor device. In an embodiment, the method further includes, before placing the TIM film: attaching another semiconductor device to the first surface of the substrate, wherein the TIM film is placed over the semiconductor device and over the another semiconductor device, wherein after placing the TIM film, the TIM film extends continuously from the semiconductor device to the another semiconductor device, wherein after attaching the lid, the another semiconductor device is disposed in the enclosed space. In an embodiment, the method further includes, before placing the TIM film: attaching another semiconductor device to the first surface of the substrate; and placing another pre-formed TIM film on the another semiconductor device, wherein after attaching the lid, the another semiconductor device and the another pre-formed TIM film are disposed in the enclosed space. In an embodiment, the method further includes, after attaching the lid: clamping the substrate and the lid between a top jig and a bottom jig; and heating the substrate and the lid for a pre-determined period of time while the substrate and the lid are clamped between the top jig and the bottom jig. In an embodiment, the method further includes, after the heating: removing the top jig and the bottom jig; and forming conductive connectors on a second surface of the substrate opposing the first surface of the substrate. In an embodiment, the TIM film is a mixture of carbon and polymer. In an embodiment, a thermal conductivity of the TIM film is larger than about 20 W/(m·K).

In accordance with an embodiment, a method of forming a semiconductor structure includes: attaching a first semiconductor structure to a first surface of a substrate, wherein the first semiconductor structure comprises: an interposer, wherein a first side of the interposer has conductive bumps formed thereon, wherein the conductive bumps are bonded to the first surface of the substrate; a first die attached to a second side of the interposer opposing the first side; and a molding material on the second side of the interposer and around the first die; placing a thermal interface material (TIM) film on a first surface of the first semiconductor structure distal from the substrate, wherein the TIM film is pre-formed before the placing, wherein after the placing, the first surface of the first semiconductor structure is disposed within boundaries of the TIM film in a plan view; and attaching a lid to the first surface of the substrate over the first semiconductor structure to form an enclosed space between the lid and the substrate, wherein the first semiconductor structure and the TIM film are disposed in the enclosed space, wherein a lower side of the lid facing the substrate contacts the TIM film. In an embodiment, the TIM film is a mixture of carbon and polymer, wherein the polymer is a resin based polymer or an acrylic based polymer. In an embodiment, a thermal conductivity of the TIM film is between about 20 W/(m·K) and about 80 W/(m·K). In an embodiment, the method further includes: before placing the TIM film, attaching a second semiconductor structure to the first surface of the substrate, wherein the TIM film is placed on the first semiconductor structure and on the second semiconductor structure, wherein the TIM film extends continuously from the first semiconductor structure to the second semiconductor structure. In an embodiment, the method further includes, after placing the TIM film and before attaching the lid: pressing the TIM film against the first surface of the first semiconductor structure by rolling a roller on the TIM film.

In accordance with an embodiment, a semiconductor structure includes: a substrate; a semiconductor device over and electrically coupled to a first surface of the substrate; a molding material around the semiconductor device; a thermal interface material (TIM) film over the molding material and the semiconductor device, wherein the TIM film covers an upper surface of the semiconductor device distal from the substrate, wherein a peripheral portion of the TIM film extends laterally beyond sidewalls of the molding material; and a lid attached to the first surface of the substrate, wherein the semiconductor device, the molding material, and the TIM film are disposed in an enclosed space between the lid and the substrate, wherein a first side of the TIM film distal from the substrate contacts the lid. In an embodiment, a second side of the TIM film facing the substrate contacts the first side of the semiconductor device. In an embodiment, the TIM film is a mixture of carbon and polymer, and wherein a thermal conductivity of the TIM film is larger than about 20 W/(m·K).

What is claimed is:

1. A method of forming a semiconductor structure, the method comprising:
attaching a semiconductor device to a first surface of a substrate;
placing a thermal interface material (TIM) film over a first side of the semiconductor device distal from the substrate, wherein the TIM film is pre-formed before the placing, wherein after the placing, a peripheral portion of the TIM film extends laterally beyond sidewalls of the semiconductor device, wherein the peripheral portion of the TIM film extends closer to the substrate than a center portion of the TIM film disposed over a center of the first side of the semiconductor device, wherein the peripheral portion of the TIM film and the center portion of the TIM film have a same thickness; and
attaching a lid to the first surface of the substrate to form an enclosed space between the lid and the substrate, wherein after attaching the lid, the semiconductor device and the TIM film are disposed in the enclosed space, wherein a first side of the TIM film distal from the substrate contacts the lid.

2. The method of claim 1, wherein after attaching the lid, a second side of the TIM film facing the substrate contacts the first side of the semiconductor device.

3. The method of claim 2, further comprising, before placing the TIM film, surrounding the semiconductor device with a molding material, wherein after placing the TIM film, the peripheral portion of the TIM film extends laterally beyond sidewalls of the molding material.

4. The method of claim 3, wherein the second side of the TIM film further contacts a top surface of the molding material distal from the substrate.

5. The method of claim 3, wherein the peripheral portion of the TIM film is spaced apart from the sidewalls of the molding material.

6. The method of claim 1, wherein attaching the lid is performed after placing the TIM film, wherein the method further comprises, after placing the TIM film and before attaching the lid:
pressing the TIM film against the first side of the semiconductor device using a roller.

7. The method of claim 1, further comprising:
before attaching the lid, attaching the TIM film to an interior surface of the lid between opposing inner sidewalls of the lid, wherein attaching the lid to the first surface of the substrate causes the TIM film to be placed on the first side of the semiconductor device.

8. The method of claim 1, further comprising, before placing the TIM film:
attaching another semiconductor device to the first surface of the substrate, wherein the TIM film is placed over the semiconductor device and over the another semiconductor device, wherein after placing the TIM film, the TIM film extends continuously from the semiconductor device to the another semiconductor device, wherein after attaching the lid, the another semiconductor device is disposed in the enclosed space.

9. The method of claim 1, further comprising, before placing the TIM film:
attaching another semiconductor device to the first surface of the substrate; and
placing another pre-formed TIM film on the another semiconductor device, wherein after attaching the lid, the another semiconductor device and the another pre-formed TIM film are disposed in the enclosed space.

10. The method of claim 1, further comprising, after attaching the lid:
clamping the substrate and the lid between a top jig and a bottom jig; and
heating the substrate and the lid for a pre-determined period of time while the substrate and the lid are clamped between the top jig and the bottom jig;
after the heating, removing the top jig and the bottom jig; and
forming conductive connectors on a second surface of the substrate opposing the first surface of the substrate.

11. The method of claim 1, wherein the TIM film is a mixture of carbon and polymer.

12. The method of claim 11, wherein a thermal conductivity of the TIM film is larger than about 20 W/(m·K).

13. A method of forming a semiconductor structure, the method comprising:

attaching a first semiconductor structure to a first surface of a substrate, wherein the first semiconductor structure comprises:
- an interposer, wherein a first side of the interposer has conductive bumps formed thereon, wherein the conductive bumps are bonded to the first surface of the substrate;
- a first die attached to a second side of the interposer opposing the first side; and
- a molding material on the second side of the interposer and around the first die;

placing a thermal interface material (TIM) film on a first surface of the first semiconductor structure distal from the substrate, wherein the TIM film is pre-formed as a sheet of uniform thickness before the placing, wherein after the placing, the first surface of the first semiconductor structure is disposed within boundaries of the TIM film in a plan view, wherein a peripheral portion of the TIM film extends beyond sidewalls of the molding material, wherein the peripheral portion extends above or below the first surface of the first semiconductor structure, wherein a height of the peripheral portion of the TIM film, measured along a direction perpendicular to the first surface of the substrate, is larger than a thickness of the peripheral portion of the TIM film; and attaching a lid to the first surface of the substrate over the first semiconductor structure to form an enclosed space between the lid and the substrate, wherein the first semiconductor structure and the TIM film are disposed in the enclosed space, wherein a lower side of the lid facing the substrate contacts the TIM film.

14. The method of claim 13, wherein the TIM film is a mixture of carbon and polymer, wherein the polymer is a resin-based polymer or an acrylic-based polymer, wherein a thermal conductivity of the TIM film is between about 20 W/(m·K) and about 80 W/(m·K).

15. The method of claim 13, further comprising:
before placing the TIM film, attaching a second semiconductor structure to the first surface of the substrate, wherein the TIM film is placed on the first semiconductor structure and on the second semiconductor structure, wherein the TIM film extends continuously from the first semiconductor structure to the second semiconductor structure.

16. The method of claim 13, further comprising, after placing the TIM film and before attaching the lid:
pressing the TIM film against the first surface of the first semiconductor structure by rolling a roller on the TIM film.

17. The method of claim 13, wherein the peripheral portion of the TIM film is spaced apart from the sidewalls of the molding material.

18. A semiconductor structure comprising:
- a substrate;
- a semiconductor device over and electrically coupled to a first surface of the substrate;
- a molding material around the semiconductor device;
- a thermal interface material (TIM) film over the molding material and the semiconductor device, wherein the TIM film covers an upper surface of the semiconductor device distal from the substrate, wherein a peripheral portion of the TIM film extends laterally beyond sidewalls of the molding material, wherein the peripheral portion of the TIM film extends above or below the upper surface of the semiconductor device, wherein the peripheral portion is spaced apart from the sidewalls of the molding material, and has a same thickness as a center portion of the TIM film disposed over a center of the upper surface of the semiconductor device; and
- a lid attached to the first surface of the substrate, wherein the semiconductor device, the molding material, and the TIM film are disposed in an enclosed space between the lid and the substrate, wherein a first side of the TIM film distal from the substrate contacts the lid.

19. The semiconductor structure of claim 18, wherein a second side of the TIM film facing the substrate contacts the first side of the semiconductor device.

20. The semiconductor structure of claim 18, wherein the TIM film is a mixture of carbon and polymer, and wherein a thermal conductivity of the TIM film is larger than about 20 W/(m·K).

* * * * *